(12) United States Patent
Golnari et al.

(10) Patent No.: US 11,143,685 B2
(45) Date of Patent: Oct. 12, 2021

(54) SYSTEM AND METHOD FOR ANOMALY DETECTION IN AN ELECTRICAL NETWORK

(71) Applicant: 3M INNOVATIVE PROPERTIES COMPANY, St. Paul, MN (US)

(72) Inventors: Golshan Golnari, Maple Grove, MN (US); Saber Taghvaeeyan, Maple Grove, MN (US); Jennifer F. Schumacher, Woodbury, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 0 days.

(21) Appl. No.: 16/647,539

(22) PCT Filed: Oct. 31, 2018

(86) PCT No.: PCT/IB2018/058544
§ 371 (c)(1),
(2) Date: Mar. 16, 2020

(87) PCT Pub. No.: WO2019/087101
PCT Pub. Date: May 9, 2019

(65) Prior Publication Data
US 2020/0256910 A1      Aug. 13, 2020

Related U.S. Application Data

(60) Provisional application No. 62/581,389, filed on Nov. 3, 2017.

(51) Int. Cl.
*G01R 31/08* (2020.01)
(52) U.S. Cl.
CPC ......... *G01R 31/086* (2013.01); *G01R 31/088* (2013.01)

(58) Field of Classification Search
CPC ............................ G01R 31/086; G01R 31/088
(Continued)

(56) References Cited

U.S. PATENT DOCUMENTS 7,596,470 B2   9/2009   Kim
8,327,306 B2   12/2012  Oh
(Continued)

FOREIGN PATENT DOCUMENTS

CN   102707194   10/2012
CN   103838959   6/2014
(Continued)

OTHER PUBLICATIONS

Doyle, "Random Walk and Electrical Networks,", Jan. 2000, Ver. 3.02, 120pages.
(Continued)

*Primary Examiner* — Farhana A Hoque
(74) *Attorney, Agent, or Firm* — Sriram Srinivasan; X. Christina Huang

(57) ABSTRACT

The present subject matter enables early or real-time detection of anomalies in electric networks. In various applications, the system detects anomalies, such as electricity theft, electricity surge, etc. It solves the difficult-to-detect problems in an electrical network, where anomalies like electricity theft or electrical surge may not be found until it has raised numerous concerns or complaints, or has created a significant impact on infrastructure functionality, service quality, or cost. In addition, the present subject matter decreases the requirement for large number of sensors and provides more cost effective and scalable solutions. The present subject matter provides a method for determining where a detected anomaly is occurring within an electrical network. Variations of the present subject matter include anomaly identification systems for addressing anomalies in
(Continued)

large networks. Various applications of the present subject matter provide guidance or effective placement of sensors in the electrical network.

15 Claims, 32 Drawing Sheets

(58) Field of Classification Search
USPC .......................................................... 324/522
See application file for complete search history.

(56) References Cited

U.S. PATENT DOCUMENTS

| | | |
|---|---|---|
| 2012/0013483 A1 | 1/2012 | Jung |
| 2012/0131674 A1 | 5/2012 | Wittenschlaeger |
| 2014/0052391 A1* | 2/2014 | Feng .................. G01R 21/06 702/58 |
| 2015/0095000 A1 | 4/2015 | Patil |
| 2015/0204701 A1 | 7/2015 | Klicpera |
| 2016/0061873 A1 | 3/2016 | Liu |
| 2016/0301207 A1 | 10/2016 | Avritzer |
| 2016/0366170 A1 | 12/2016 | Bell |
| 2017/0104775 A1 | 4/2017 | Vasseur |

FOREIGN PATENT DOCUMENTS

| | | |
|---|---|---|
| CN | 106093704 | 11/2016 |
| CN | 106526419 | 3/2017 |
| EP | 1073911 | 2/2001 |
| EP | 2806572 | 11/2014 |
| WO | 2698642 | 2/2014 |
| WO | WO 2017-030809 | 2/2017 |
| WO | WO 2017-030812 | 2/2017 |
| WO | WO 2017-030869 | 2/2017 |
| WO | WO 2018-044461 | 3/2018 |
| WO | WO 2018-044462 | 3/2018 |
| WO | WO 2018-044590 | 3/2018 |

OTHER PUBLICATIONS

Doyle, "Random walks and electrical networks", Jul. 2006, 118 pages.
Golnari, "Pivotality of Nodes in Reachability Problems Using Avoidance and Transit Hitting Time Metrics," 7th Annual Workshop on Simplifying Complex Networks for Practitioner, May 2015, pp. 1073-1078.
Steinitz, "Optimal Camera Placement.", Technical Report No. UCB/EECS-2012-69, University of California, 2012, pp. 1-39.
International Search report for PCT International Application No. PCT/IB2018/058544 dated Mar. 13, 2019, 5 pages.

* cited by examiner

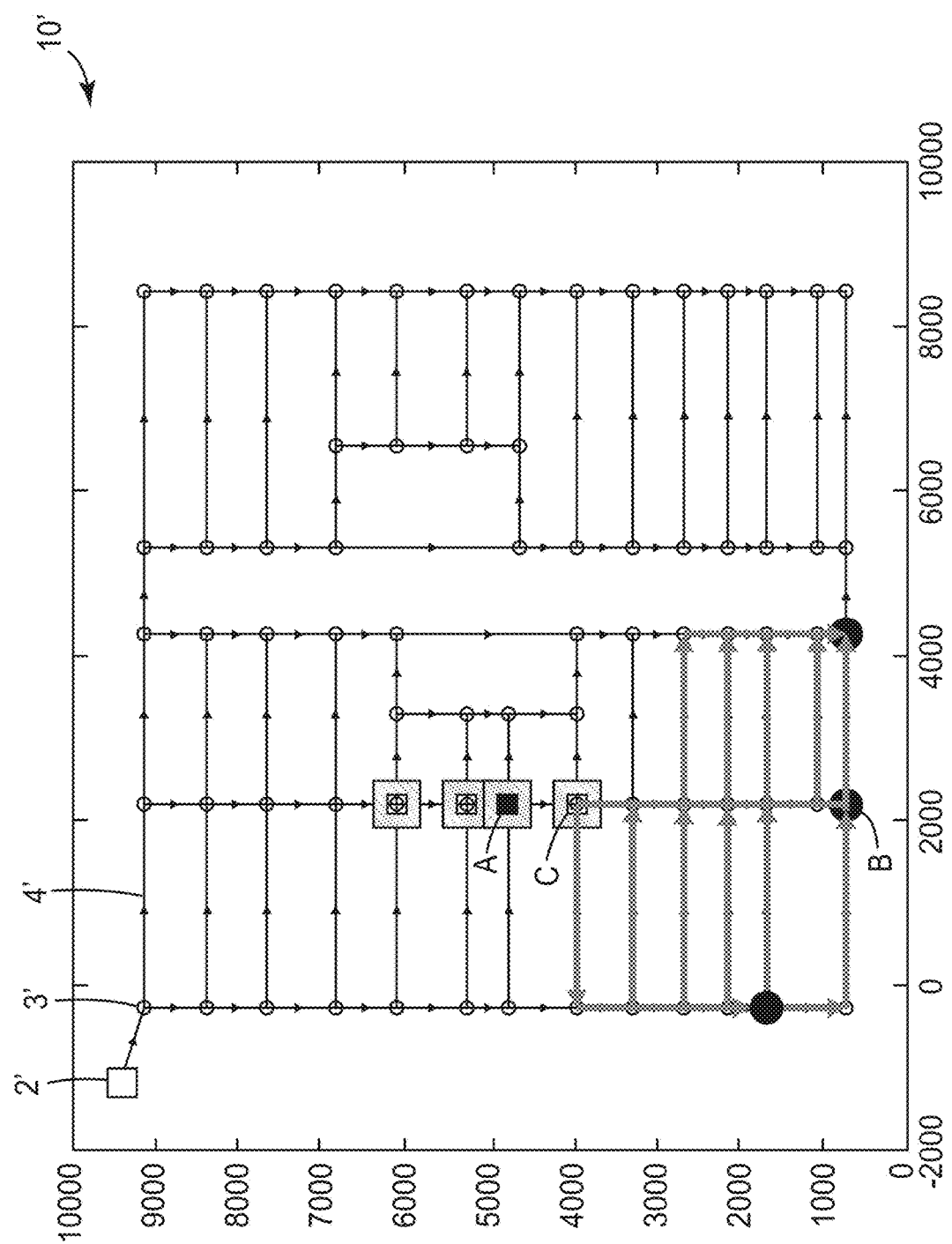
FIG. 3B
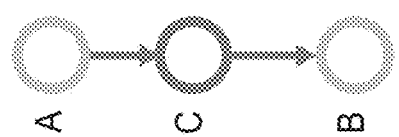

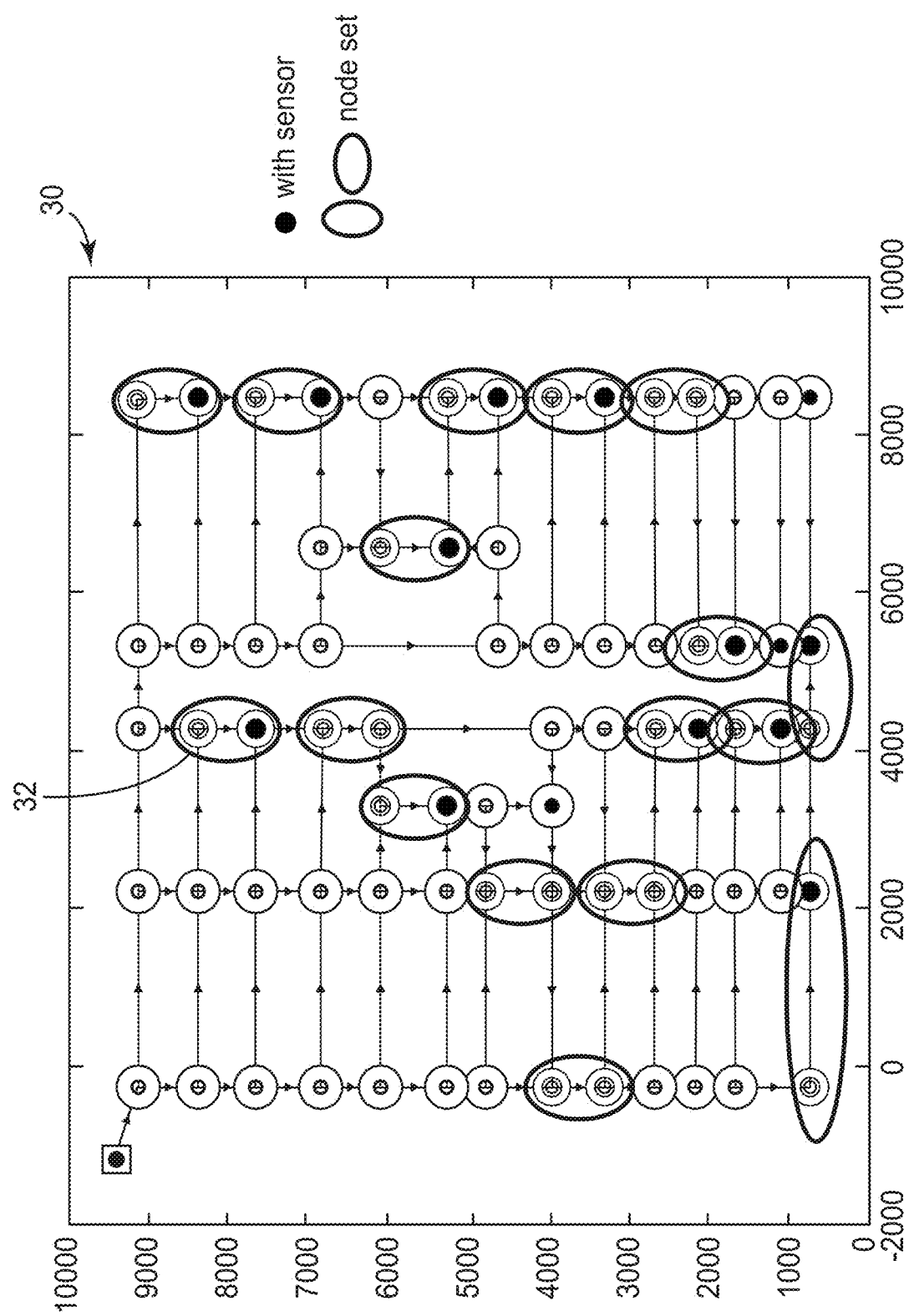

IS SYMMETRICAL FOR BIDIRECTINAL

1000

| A= | 1 | 2 | 3 | 4 | 5 | 6 | 7 |
|---|---|---|---|---|---|---|---|
| 1 | 0 | 0.01 | 0.01 | 0 | 0 | 0.01 | 0 |
| 2 | 0.01 | 0 | 0.01 | 0.01 | 0 | 0 | 0.01 |
| 3 | 0.01 | 0.01 | 0 | 0.01 | 0 | 0.01 | 0.01 |
| 4 | 0 | 0.01 | 0.01 | 0 | 0.01 | 0 | 0.01 |
| 5 | 0.01 | 0.01 | 0.01 | 0.01 | 0 | 0.01 | 0 |
| 6 | 0.01 | 0 | 0.01 | 0 | 0 | 0 | 0 |
| 7 | 0 | 0.001 | 0.001 | 0 | 0.001 | 0 | 0 |

*FIG. 15*

SYSTEM AND METHOD FOR ANOMALY DETECTION IN AN ELECTRICAL NETWORK

Cross-Reference to Related Applications

This Application is a National Stage filing under 35 U.S.C. § 371 of International Application No. PCT/IB2018/058544, filed 31 Oct. 2018, which claims the benefit of Provisional U.S. Patent Application No. 62/581,389, filed 3 Nov. 2017, the entire content of each of which is incorporated herein by reference.

TECHNICAL FIELD

The present disclosure relates to methods and systems of modeling, analyzing, monitoring, and detecting electrical networks.

BACKGROUND

The monitoring of electrical networks is important to provide safe and effective operation of such networks. Problems can arise in networks that are not monitored or are poorly monitored. An example is the annual loss to electricity theft happening in India which is about $16 B, ⅓ of total generated power, and about $6 B in the US, where electricity is the third most stolen item.

Small networks can be monitored and controlled using a small number of sensors, and placement of the sensors in a small system is typically straightforward. However, large networks can be a challenge to monitor because, depending on the number of nodes of the system, it may be impractical to monitor every node. Even if every node could be monitored, the amount of time it would take to take measurements at each node, store them, and analyze them would create a vast amount of data and processing would be prohibitive in very large networks. In large networks where sensors are limited, the placement of such sensors is difficult to determine. The difficulties are compounded by the fact that networks can involve bidirectional information, nodes are added and subtracted over time, nodes can experience failures and other anomalies, and communications over the network and its sensors are jeopardized when equipment servicing a node fails. Network operators need to know about anomalies and other events occurring in large networks which impact network performance.

Therefore, there is a need in the art for monitoring large networks. Such monitoring should provide an indication of an anomaly, and preferably provide a way to isolate the portions of the network experiencing the anomaly. There is a further need in the art for various anomaly handling systems for large networks. There is also a further need for guidance about effective placement of sensors in the network.

SUMMARY

The present subject matter enables early or real-time detection of anomalies in electric networks. In various embodiments, the system detects anomalies, such as electricity theft, electricity surge. It solves the difficult-to-detect problems in an electrical network, where anomalies like electricity theft or electrical surge may not be found until it has raised numerous concerns or complaints, or has created a significant impact on infrastructure functionality, service quality, or cost. In addition, the present subject matter decreases the requirement for large number of sensors and provides more cost effective and scalable solutions while removing the hassle of working with huge and unnecessary data.

In various embodiments, the present subject matter provides a method for determining where a detected anomaly is occurring within the electric network. In various embodiments, the present subject matter includes anomaly handling systems for addressing anomalies in large networks. In various embodiments, the present subject matter provides guidance or effective placement of sensors in the electrical network.

In various embodiments, the present subject matter provides sensor data and network structural information and modeling with artificial intelligence to detect and localize the source of anomaly and predict the impact on the rest of the network.

Various aspects and advantages of exemplary embodiments of the disclosure have been summarized. The above Summary is not intended to describe each illustrated embodiment or every implementation of the present certain exemplary embodiments of the present disclosure. The Drawings and the Detailed Description that follow more particularly exemplify certain preferred embodiments using the principles disclosed herein.

BRIEF DESCRIPTION OF THE DRAWINGS

These and other features, aspects, and advantages of the present disclosure are better understood when the following Detailed Description is read with reference to the accompanying drawings, in which:

FIG. 3B illustrates a schematic diagram of an electrical network provided with sensors, according to an embodiment.

FIG. 5C illustrates grouping adjacent nodes into node sets in the model of FIG. 5B, according to an embodiment.

FIG. 15 is a table showing measured resistance values of the links of the structure of FIG. 14, according to an embodiment.

Figure 1:
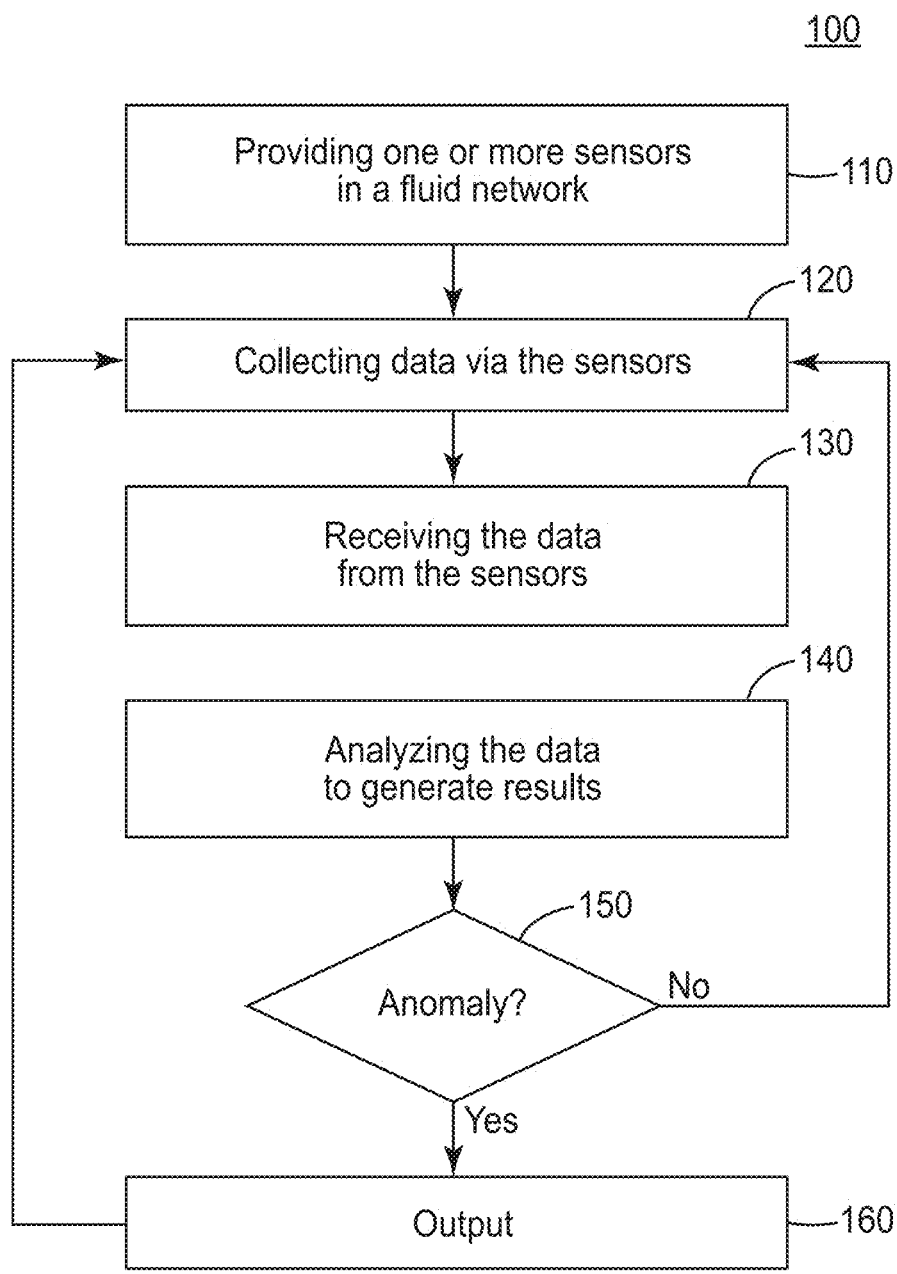
FIG. 1 is a flow diagram of a method of detecting an anomaly of interest in an electrical network, according to an embodiment.

In the drawings, like reference numerals indicate like elements. While the above-identified drawing, which may not be drawn to scale, sets forth various embodiments of the present disclosure, other embodiments are also contemplated, as noted in the Detailed Description. In all cases, this disclosure describes the presently disclosed disclosure by way of representation of exemplary embodiments and not by express limitations. It should be understood that numerous other modifications and embodiments can be devised by those skilled in the art, which fall within the scope and spirit of this disclosure.

DETAILED DESCRIPTION

The following detailed description of the present subject matter refers to subject matter in the accompanying drawings which show, by way of illustration, specific aspects and embodiments in which the present subject matter may be practiced. These embodiments are described in sufficient detail to enable those skilled in the art to practice the present subject matter. References to "an", "one", or "various" embodiments in this disclosure are not necessarily to the same embodiment, and such references contemplate more than one embodiment. The following detailed description is demonstrative and not to be taken in a limiting sense. The scope of the present subject matter is defined by the appended claims, along with the full scope of legal equivalents to which such claims are entitled.

The present disclosure provides methods and systems to enable early or real-time detection of problems (e.g., electricity theft, power surge, equipment failures, etc.) in an electrical network, and enable preemptive actions including predicting when and where an issue/problem in an electrical network may be likely to occur. Electrical networks described herein may include a power distribution network, such as for a state or municipality, industrial plant, office complex, or other large electrical power network, etc. Methods and systems described herein can solve the problem of difficult-to-detect problems in an electrical network, where anomalies like electricity theft or electrical surge may not be found until it has raised numerous concerns or complaints, or has created a significant impact on infrastructure functionality, service quality, or cost.

The present subject matter, in various embodiments, detects and/or localizes an anomaly (e.g., electricity theft) in an electrical network with limited sensor measurements before and after an anomaly has occurred. For example, in various embodiments the present subject matter can estimate an amount of stolen power and its location given that it occurs within the sensor coverage area. Additionally, various embodiments of the present system can estimate the voltage/current level of other non-observing nodes of the network to identify the impacted locations or the locations at high risk. In various embodiments, the present subject matter can identify the coverage of sensors for anomaly localization as well as sensor placement, meaning the minimal number of sensors and their best or nearly best location to fulfill an intended network goal.

In various embodiments, the present subject matter provides sensor data and network structural information and modeling with artificial intelligence to detect and localize the source of anomaly and predict the impact on the rest of the network.

FIG. 1 illustrates a flow diagram of a method 100 of monitoring anomaly of interest in an electrical network. At 110, one or more sensors are provided for the electrical network. The sensors can be any types of sensors capable of collecting data related to one or more parameters of the electrical network such as, for example, a current sensor, a voltage sensor, a frequency sensor, a line detection sensor, an equipment failure or fault sensor, etc. The sensors can be located at various nodes and in various locations of the electrical network. For example, sensors can be provided at the location of every home in a power distribution network, at every building in a power distribution network at every transformer in a power distribution network, at every power distribution center in a power distribution network, etc. The present disclosure provides methods on how to determine sensor placement in the electrical network and methods on how to determine sensor coverage in the electrical network based on modeling the electrical network, which will be described further below. The method 100 then proceeds to 120.

At 120, the sensors are instructed by a processor to collect the data. The processor can be located in a remote computer (e.g., server or the Cloud) out of the electrical network. In some embodiments, sensors may be provided for current or voltage use at nodes that are distributed in the electrical network, and data collected by the sensor may indicate status or trending of current or voltage of the respective nodes. In some embodiments, each sensor can be instructed to collect data at an initial time, which can be stored in a database as initial values. The method 100 then proceeds to 130.

At 130, the collected data are transferred from the sensors and received by the processor. The data can be transmitted directly or indirectly via suitable technologies such as, for example, Wi-Fi, Bluetooth, Bluetooth Low Energy (BLE), cellular, Ethernet, etc. The collected data can be transferred in real time from the sensors, or be transferred at a later date to provide a retrospective indication of the electrical network. Data can also be collected at regular time intervals or an adapted time schedule based on a contextual situation. For example, data can be collected or transferred at a relatively higher frequency after a storm that may have damaged the electrical network, or when equipment at nodes are predicted to be near end-of-life. The method 100 then proceeds to 140.

At 140, the received data are analyzed by the processor to generate results. In some embodiments, the received data can be analyzed based on a model of the electrical network, such as that provided by network information 170. In some embodiments, a model of the electrical network can include directionally connected nodes representing electrical infrastructure disposed in the electrical network. The nodes can be ordered as a partially order set, where order of nodes may change depending on directions of electrical flow between nodes. For example, electrical flow direction may change where there are fluctuations in "usage" at some of the nodes. The model can be representation(s) of the electrical network including, for example, a directed acyclic graph (DAG). The representations of the electrical network (e.g., a directed acrylic graph) can be stored or processed by the processor as a matrix data structure such as, for example, an adjacency matrix, a reachability matrix, etc.

In some embodiments, historical data or other data related to the electrical network can be combined with the received real-time data from the sensors and analyzed by the processor. Such other types of data may include, for example, previous issues/problems in the electrical network (e.g., voltage or current thresholds exceeded, faults or failures detected, etc.), weather (thunderstorms, tornadoes, flooding, etc., that might be the cause of a damage on the electrical network in certain areas), current flow or conductivity variations, and reported damage (e.g., fallen tree, electrical lines, brownouts and their correlation with power network damage). In some embodiments, baseline measurements can be conducted to determine whether there are any initial power (voltage or current or intermittent connections, etc.) issues during installation of the electrical network infrastructure. In some embodiments, historical data from the sensors related to the electrical network can be analyzed in terms of time, geography, etc., to derive an anomalous pattern. The data can be stored in, for example, a database associated with the processor or in a Cloud. The generated results including, for example, current or voltage or power draw trends, analysis reports, alerts, alarms, etc. The method 100 then proceeds to 150.

At 150, based on the analysis of the data, it is determined, via the processor or an operator/user, whether there is anomaly of interest in the electrical network. Possible anomalies of interest may include, for example, voltage or current drops or spikes, exceptionally high power draws, shorts or other events causing breakers to trip and transformers to fail or become compromised, or combinations thereof, etc. In some embodiments, the processor may further determine possible locations of the anomaly inside the electrical network. When there is an anomaly in the electrical network, the method 100 proceeds to 160 to generate an output in the form of, for example, an alarm, an alert, a report, etc. When there is no anomaly in the electrical network, the method 100 proceeds back to 120. In some embodiments, the output may include prediction of future electrical network problems/issues such as, for example, power delivery failures based on similar environments by classifying the electrical network based on trends, size, usage, etc. In some embodiments, the output may include whether someone is stealing resources from the electrical network via a noticeable difference in network characteristics (e.g., a new "node" in the model being detected). In some embodiments, the output may be used to provide prioritization of power sourcing, shutdown, and/or diversion based on the infrastructure it is serving. For example, if a high power draw is detected for air conditioning etc., power delivery may be prioritized to a hospital over other infrastructure. In some embodiments, the output may be provided to homeowners by comparing their historical usage to their neighbors (e.g., to determine whether an anomalous current or voltage or power draw is localized to the house).

Figure 2:
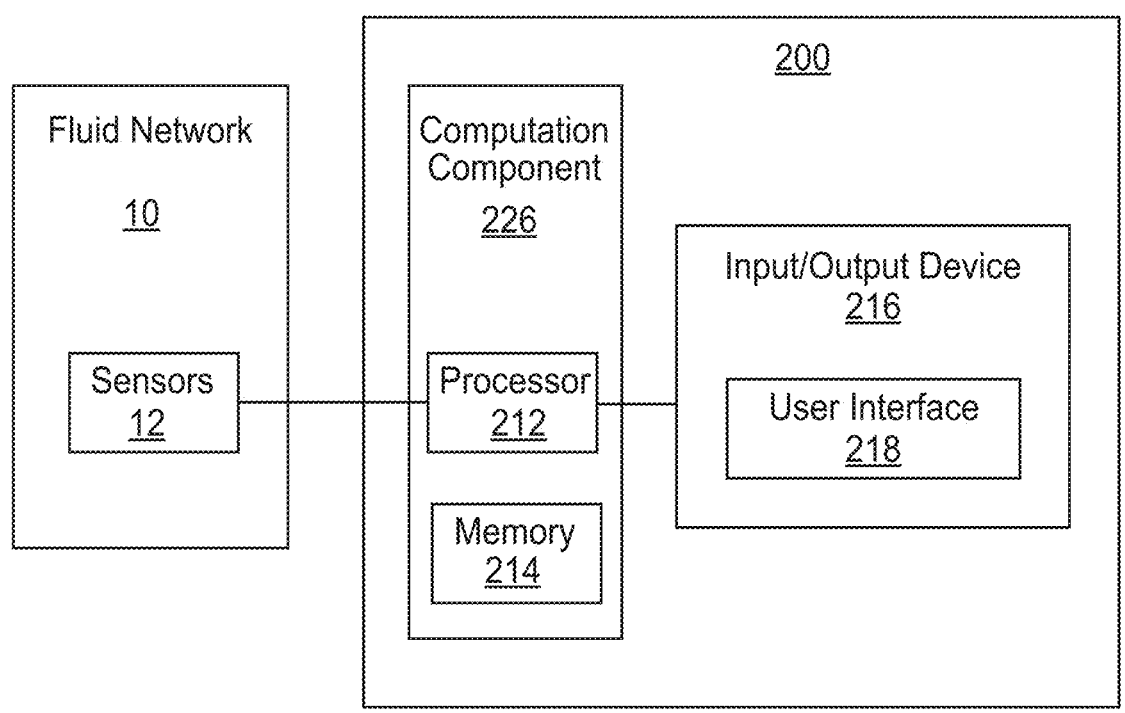
FIG. 2 illustrates a block diagram of a system for detecting an anomaly of interest in an electrical network, according to an embodiment.

FIG. 2 illustrates a detection system 200 for determining an anomaly of interest in an electrical network 10 by implementing, for example, the method 100, according to one embodiment. The electrical network 10 can include a power distribution network such as, for example, a state or city power company, a power plant for a business, hospital, or school, a specialized power system such as for an office complex or office tower, a construction or manufacturing site, etc. One or more sensors 12 are provided for various locations inside the electrical network 10.

The detection system 200 includes the sensors 12, a computation component 226, and one or more input/output devices 216. The sensors 12 can be any types of sensors capable of collecting data related to one or more parameters of the electrical network such as, for example, a current sensor, a voltage sensor, a power sensor, a line fault or failure sensor, a frequency sensor, a consumption sensor, etc. Exemplary sensors may include passive, wireless sensors. The sensors 12 may include a radio-frequency identification (RFID), which can identify individual electrical infrastructure (e.g., an air conditioning system at a node) and its related information (e.g., size, model, usage, time of installation, status, etc.).

In some embodiments, the electrical network 10 may be an electrical network provided with its own power conditioning equipment, breakers, safety equipment, etc. The sensors 12 can be provided for the equipment of the network.

In the embodiment of FIG. 2, the computation component 226 includes a processor 212 and a memory 214. The computation component 226 is functionally connected to the sensors 12, receives signals or data related to the electrical network 10 from the sensors 12, and analyzes the received signals/data to generate results including, for example, analysis reports, alerts, alarms, etc. In some embodiments, the data received from the sensors 12 can be stored in the memory 214. In some embodiments, a model can be created to represent the electrical network 10. The model may include directionally connected nodes representing infrastructure of the electrical network. The model can include, for example, a directed graph or a partially ordered set, which is stored in the memory 214 as data in the form of an adjacency matrix. The processor 212 can analyze the model by interpreting and executing instructions from a software program associated with the processor 212.

The memory 214 stores information. In some embodiments, the memory 214 can store instructions for performing the methods or processes described herein. In some embodiments, data related to the electrical network, or the model of the electrical network can be pre-stored in the memory 214.

The memory 214 may include any volatile or non-volatile storage elements. Examples may include random access memory (RAM) such as synchronous dynamic random access memory (SDRAM), read-only memory (ROM), non-volatile random access memory (NVRAM), electrically erasable programmable read-only memory (EEPROM), and FLASH memory. Examples may also include hard-disk, magnetic tape, a magnetic or optical data storage media, a compact disk (CD), a digital versatile disk (DVD), a Blu-ray disk, and a holographic data storage media. Data may also be stored in a Cloud computing environment. It is understood that combinations of the foregoing memory 214 may be employed as well.

The processor 212 may include, for example, one or more general-purpose microprocessors, specially designed processors, application specific integrated circuits (ASIC), field programmable gate arrays (FPGA), a collection of discrete logic, and/or any type of processing device capable of executing the techniques described herein. In some embodiments, the processor 212 (or any other processors described herein) may be described as a computing device. In some embodiments, the memory 214 may be configured to store program instructions (e.g., software instructions) that are executed by the processor 212 to carry out the processes or methods described herein. In other embodiments, the processes or methods described herein may be executed by specifically programmed circuitry of the processor 212. In some embodiments, the processor 212 may thus be configured to execute the techniques for analyzing data related to an electrical network described herein. The processor 212 (or any other processors described herein) may include one or more processors.

Input/output device 216 may include one or more devices configured to input or output information from or to a user or other device. In some embodiments, the input/output device 216 may present a user interface 218 where a user may control the assessment of an electrical network. For example, user interface 218 may include a display screen for presenting visual information to a user. In some embodiments, the display screen includes a touch sensitive display. In some embodiments, a user interface 218 may include one or more different types of devices for presenting information to a user. The user interface 218 may include, for example, any number of visual (e.g., display devices, lights, etc.), audible (e.g., one or more speakers), and/or tactile (e.g., keyboards, touch screens, or mice) feedback devices. In some embodiments, the input/output devices 216 may represent one or more of a display screen (e.g., a liquid crystal display or light emitting diode display) and/or a printer (e.g., a printing device or component for outputting instructions to a printing device). In some embodiments, the input/output device 116 may be configured to accept or receive program instructions (e.g., software instructions) that are executed by the processor 112 to carry out the embodiments described herein.

The detection system 200 may also include other components and the functions of any of the illustrated components including the processor 212, the memory 214, and the input/output devices 216 may be distributed across multiple components and separate devices such as, for example, computers. The system 200 may be configured as a workstation, desktop computing device, notebook computer, tablet computer, mobile computing device, or any other suitable computing device or collection of computing devices. The system 200 may operate on a local network or be hosted in a Cloud computing environment. The illustrated components of FIG. 2 are shown merely to explain various aspects of the present disclosure and the addition or removal of components would be apparent to one of skill in the art.

The detection system 200 allows a user to determine anomalies in an electrical network in real time. In some embodiments, the collected data from an electrical network can be automatically analyzed in real time, via the processor, based on a model of the electrical network to generate results for output. The detection system 200 further allows a user to predict possible issues/problems that an electrical network may have in the future.

Figure 3A:
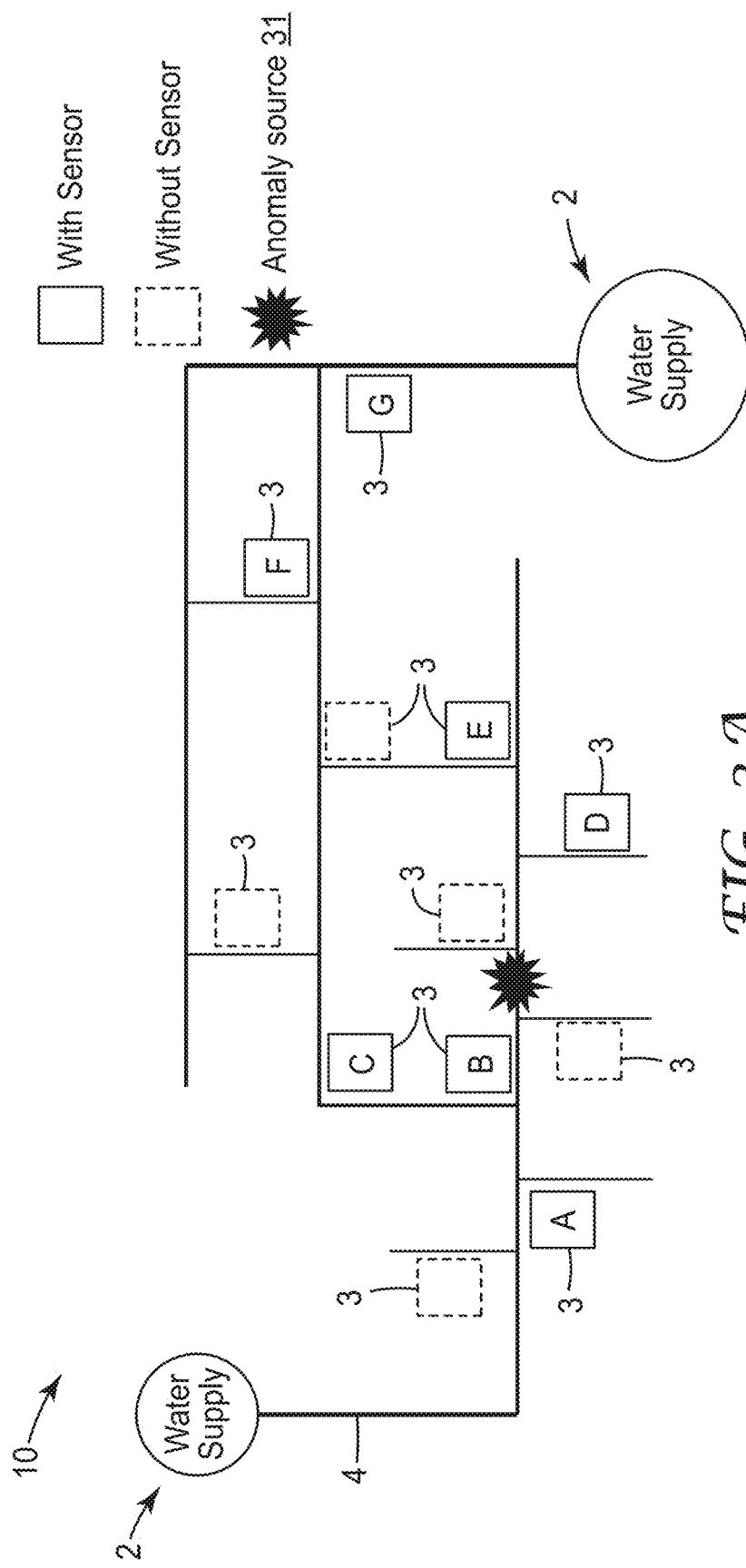
FIG. 3A illustrates a schematic diagram of an electrical network provided with sensors, according to an embodiment.

FIG. 3A illustrates a diagram of an electrical network 10 as an exemplary electrical network, according to one embodiment. Power is supplied from power supply 2. Various electrical device infrastructures 3 are connected by power lines 4. Sensors are provided at selected locations A through G in the electrical network 10. The sensors can be functionally connected to a processor of a detection system such as the system 200 of FIG. 2, and configured to collect data at the various locations in the network 10, which can then be transmitted to the processor of the detection system to analyze. Based on the sensor data received from the nodes at locations A-G, the processor of the detection system can analyze the data and determine that the nodes at locations A-C, F and G have "good" power condition, while the nodes at locations D and E have "bad" power condition in the illustrated example. The processor can further determine, based on a model of the network 10, that the possible cause of anomaly (e.g., short or open circuit) may be located at node 31 in the network 10 between the locations B and D.

FIG. 3B illustrates a diagram of an electrical network 10' as another exemplary electrical network. Power is supplied from a power supply 2' to the power line network 10'. Various electrical device infrastructures 3' are connected by power lines 4'. The various electrical device infrastructures 3' can be represented by nodes that are directionally connected where arrows correspond to current or power flow directions in the electrical network. As an example, electrical device infrastructure located at nodes A, B and C are directionally connected as shown in the left inset, where node C is a dependency-connection between node A and node B, and nodes A and B are therefore not dependency (d)-separated Node C is defined as a d-separator in the path from node A to node B.

In the present disclosure, models are created to represent various electrical networks. A model of electrical network can include directionally connected nodes representing the electrical device infrastructure disposed in the electrical network. Properties of current or power flow such as, e.g., flow directions, flow rate, within the electrical network can be measured by flow sensors or derived using Kirchoff's Current Law (KCL), Kirchoff's Voltage Law (KVL), power conservation principles, or based on factors such as, for example, trended power, voltage or current data, equipment utilization, network expansion or contraction, special network demands (e.g., extremely hot weather and commensurate power draws for air conditioning, etc.), system failures (open or short circuits, such as due to damage or breaker operation or shunting of power or current, etc.), specialized metering or measurement at a node or location, etc. In some embodiments, a model can be representation(s) of the electrical network including, for example, a directed acrylic graph (DAG). The representations of the electrical network (e.g., a directed acrylic graph) can be stored or processed by a processor as a matrix data structure matrix such as, for example, an adjacency matrix, a reachability matrix, etc.

Figure 4A:
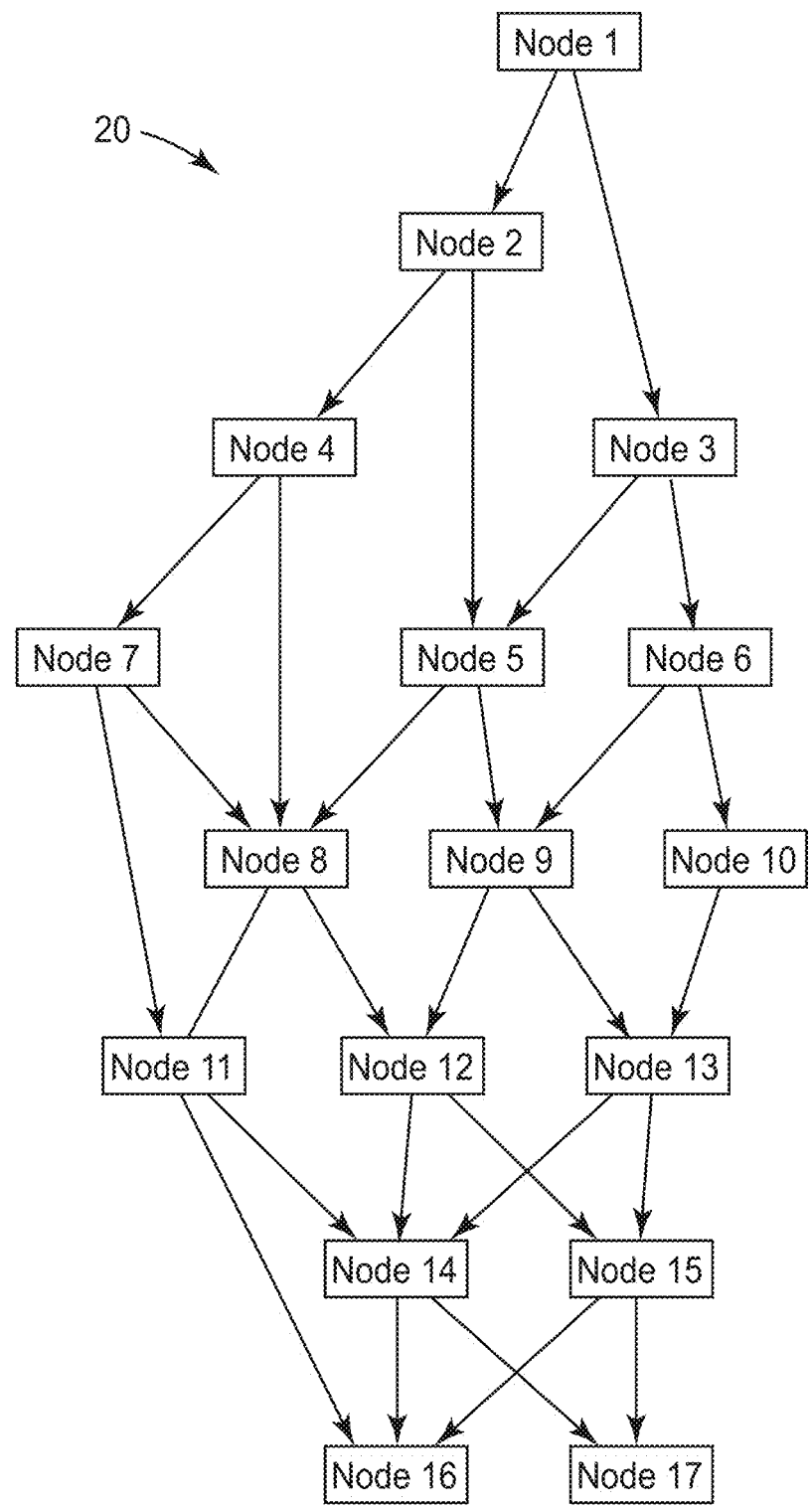
FIG. 4A illustrates a directed graph representing an electrical network, according to an embodiment.

FIG. 4A illustrates a model 20 of an electrical network, according to one embodiment. In the model 20, various electrical device infrastructure are represented by nodes 1 through 17. For example, node 1 may represent a power supply. Nodes 1-17 are directionally connected to form a directed graph, which is a partially ordered set. The arrows in FIG. 4A correspond to power or current flow directions in the electrical network. It is to be understood that an electrical network can be represented by various directed graphs. A directed graph of an electrical network can further be represented by a matrix data structure such as, for example, an adjacency matrix, reachability matrix, etc. The matrix data structure can be stored and/or analyzed by a processor.

The present disclosure provides methods to analyze, via a processor such as processor 212 of FIG. 2, a model of electrical network. In some embodiments, the model or representations of the model can be analyzed to evaluate whether a node or a set of nodes satisfies one or more localizability criteria. In some embodiments, the localizability criteria may include, for example, for a given node or node set, evaluating whether there are at least two sensors disposed downstream of the given node or node set which have the respective paths not sharing any d-separator with respect to the given node or node set. When a given node satisfies the localizability criteria, no sensor is provided to the given node. When the given node does not satisfy the localizability criteria, one or more sensors are provided to the given node. Instructions associated with the processor can be interpreted and executed to analyze the model or representations of the model. The above process of analyzing may include dynamic programming including a bottom-up approach starting from the lowest level in the representations of the model, as further explained by one embodiment as shown in FIG. 4B.

Figure 4B:
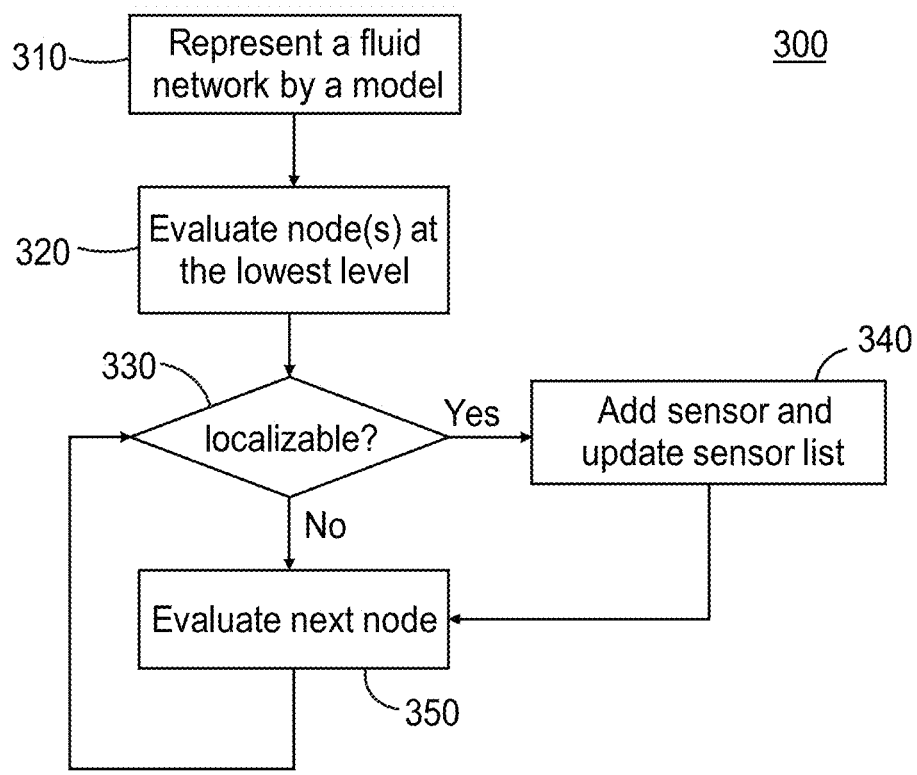
FIG. 4B is a flow diagram of a method of determining sensor placement in an electrical network, according to an embodiment.

FIG. 4B is a flow diagram of a method 300 for determining sensor placement in an electrical network, according to one embodiment. At 310, an electrical network is represented by a model. The model can be, for example, a directed graph such as the directed graph 20 shown in FIG. 4A. The directed graph can be a partial order set where nodes are ordered in different levels. The method 300 then proceeds to 320. At 320, one or more nodes or node sets at the lowest level of the model are evaluated to determine at 330 whether the node or node set satisfies localizability criteria, e.g., whether there are at least two sensors besides the given node or node set which have the respective paths not sharing any d-separator with respect to the given node or node set. When the node or node set satisfies the localization criteria, the method 300 proceeds to 340. When the node or node set does not satisfy the localizability criteria, the method 300 proceeds to 350. At 340, sensor(s) is added to the node or node set, and the model (e.g., the graph) is updated with the added sensor(s). At 350, next mode or mode set at the same level or an upper level is evaluated in the same manner. The process continues until the node(s) at the upper most level of the electrical network is evaluated.

Figure 4C:
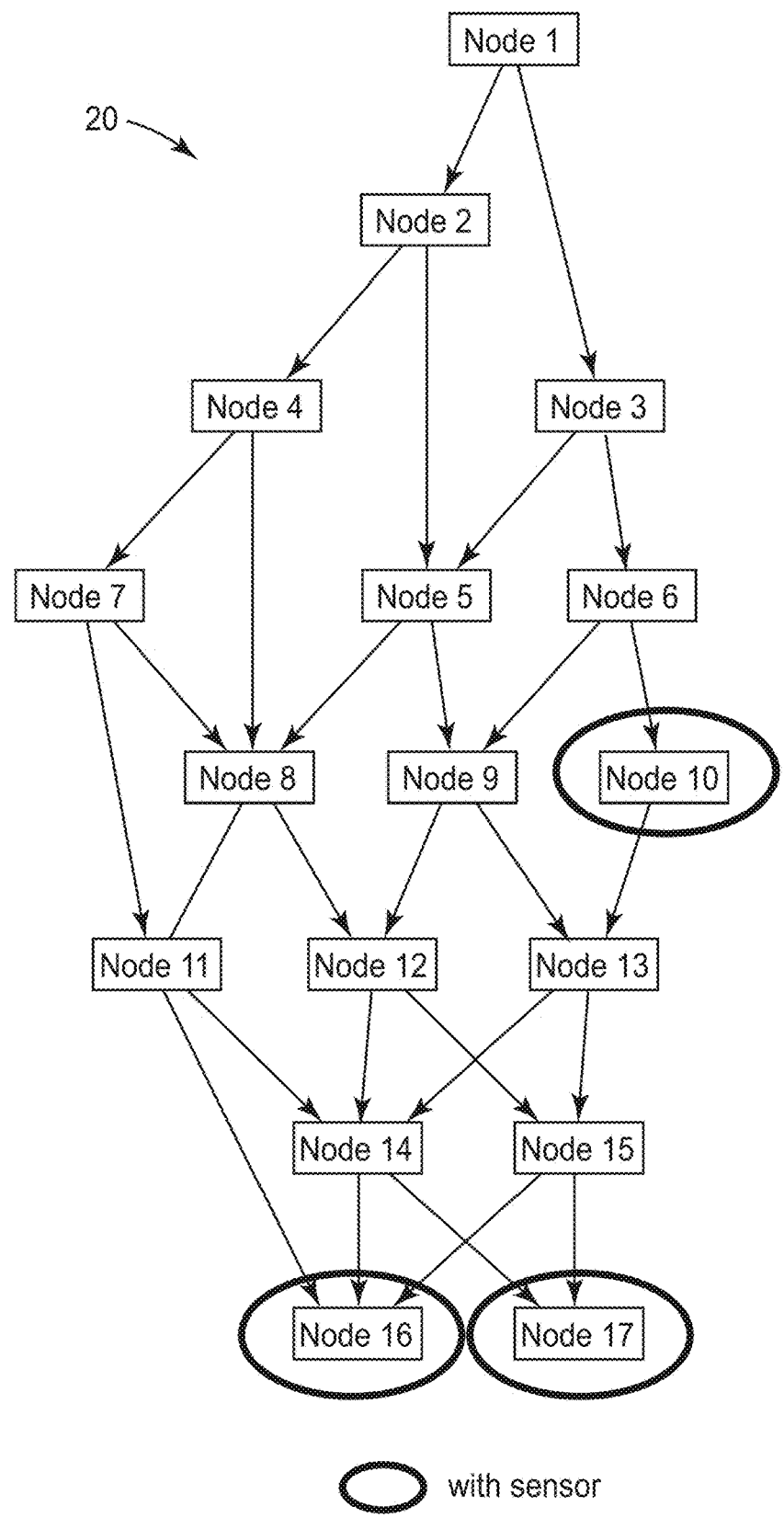
FIG. 4C illustrates the directed graph of FIG. 4A provided with sensors at selected locations, according to an embodiment.
Figure 4D:
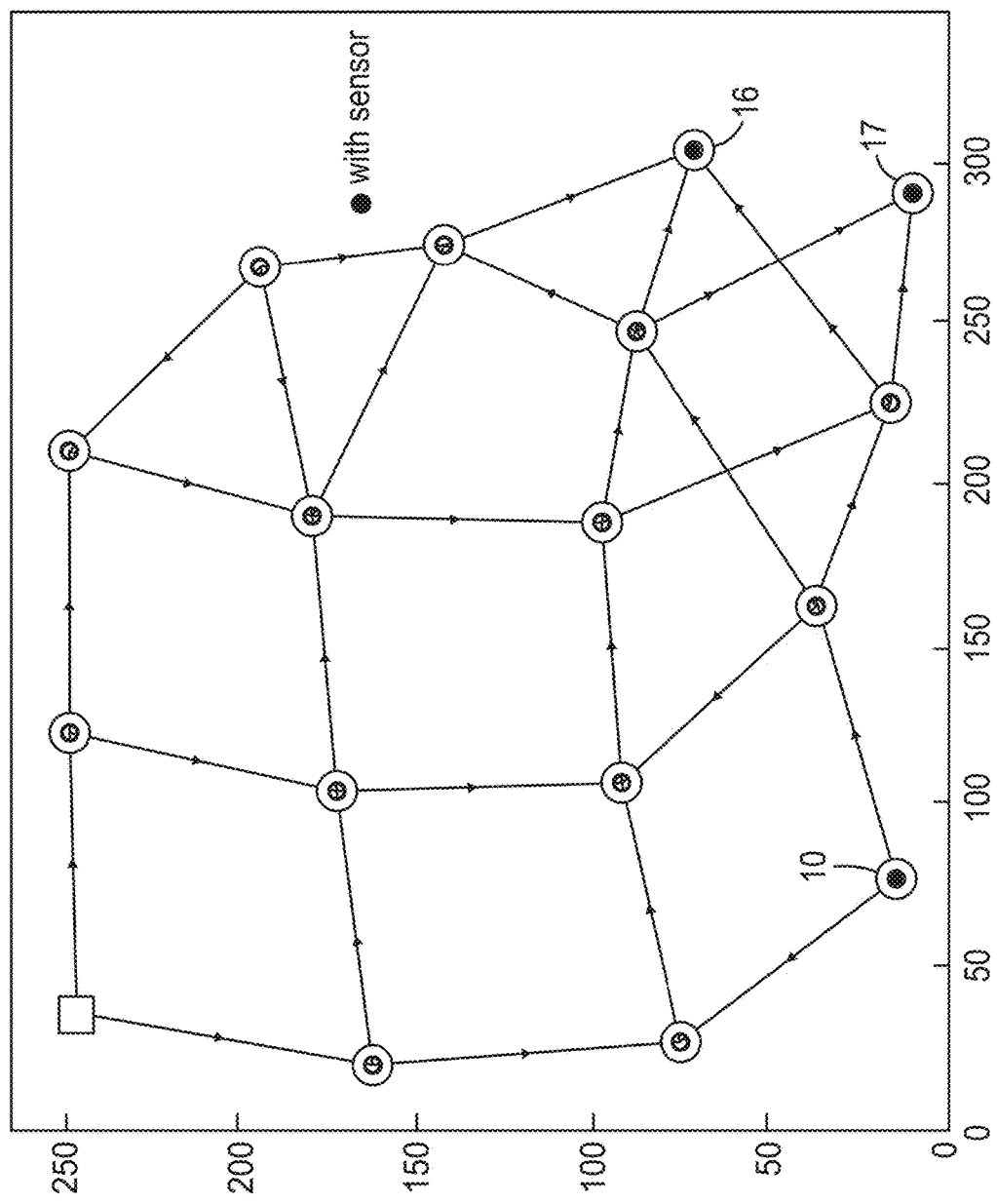
FIG. 4D illustrates a reformatted version of the directed graph of FIG. 4C provided with sensors at selected locations, according to an embodiment.

Application of the method 300 of FIG. 4B to the electrical network represented by the model 20 of FIG. 4A produces results that are shown in FIGS. 4C-D. The evaluation starts from the lowest level, e.g., node 16 or 17 in the directed graph 20. It is found that nodes 16 and 17 do not satisfy the localizability criteria. There are no sensors downstream of node 16 or 17. Sensors are added at nodes 16 and 17, respectively, and the directed graph 20 is updated with the added sensors at nodes 16 and 17. Then, node 14 or 15 at the next level can be evaluated. It is found that nodes 14 and 15 satisfy the localizability criteria. There are two sensors downstream at nodes 16 and 17, and the respective paths from nodes 14 and 15 to the two sensors at nodes 16 and 17 do not sharing any d-separator. No sensors will be provided to nodes 14 and 15. This bottom-up approach continues and each node can be evaluated. It is found that nodes 11-13, 8, 9, and 1-7 satisfy the criteria and no sensors will be provided to these nodes. Node 10 does not satisfy the localizability criteria. The respective paths from node 10 to the two sensors at nodes 16 and 17, e.g., 10-13-14-16 and 10-13-15-17, can share a d-separator (e.g., node 13). A sensor is provided to node 10 and the directed graph 20 is updated.

With sensors being placed at nodes 16, 17 and 10, it is sufficient to cover the whole electrical network. That is, by analyzing the data from the sensors located at nodes 10, 16 and 17, a processor of a detection system can explicitly determine the status at each node in the electrical network. FIG. 4D illustrates a reformatted version of the directed graph of FIG. 4C provided with sensors at selected locations. In some embodiments, when there is an anomaly in the electrical network, the processor can explicitly determine the location of anomaly by analyzing the sensor data. For example, when sensors data indicate that nodes 11, 14 and 16 have a fault or detected anomaly and the remaining nodes have no detected fault or anomaly, the processor can determine that the cause of fault or anomaly is located at node 11.

When an electrical network requires n sensors to completely cover the electrical network, a complexity index of the network can be expressed as the ratio of the required number n of sensors and the number of nodes in the electrical network. For example, the complexity index of the electrical network 20 of FIG. 4A is 3/17.

It is to be understood that in some embodiments, one or more nodes of a model can be grouped into respective node sets before evaluation. For example, nodes 14 and 15 of FIG. 4A can be grouped into a single node set which can be evaluated. Each node set can include one or more adjacent nodes, and each node set can be evaluated, in the same manner as shown in FIGS. 4B-C, to determine whether the node sets or a combination of nodes and node sets satisfy the localizability criteria.

Figure 5A:
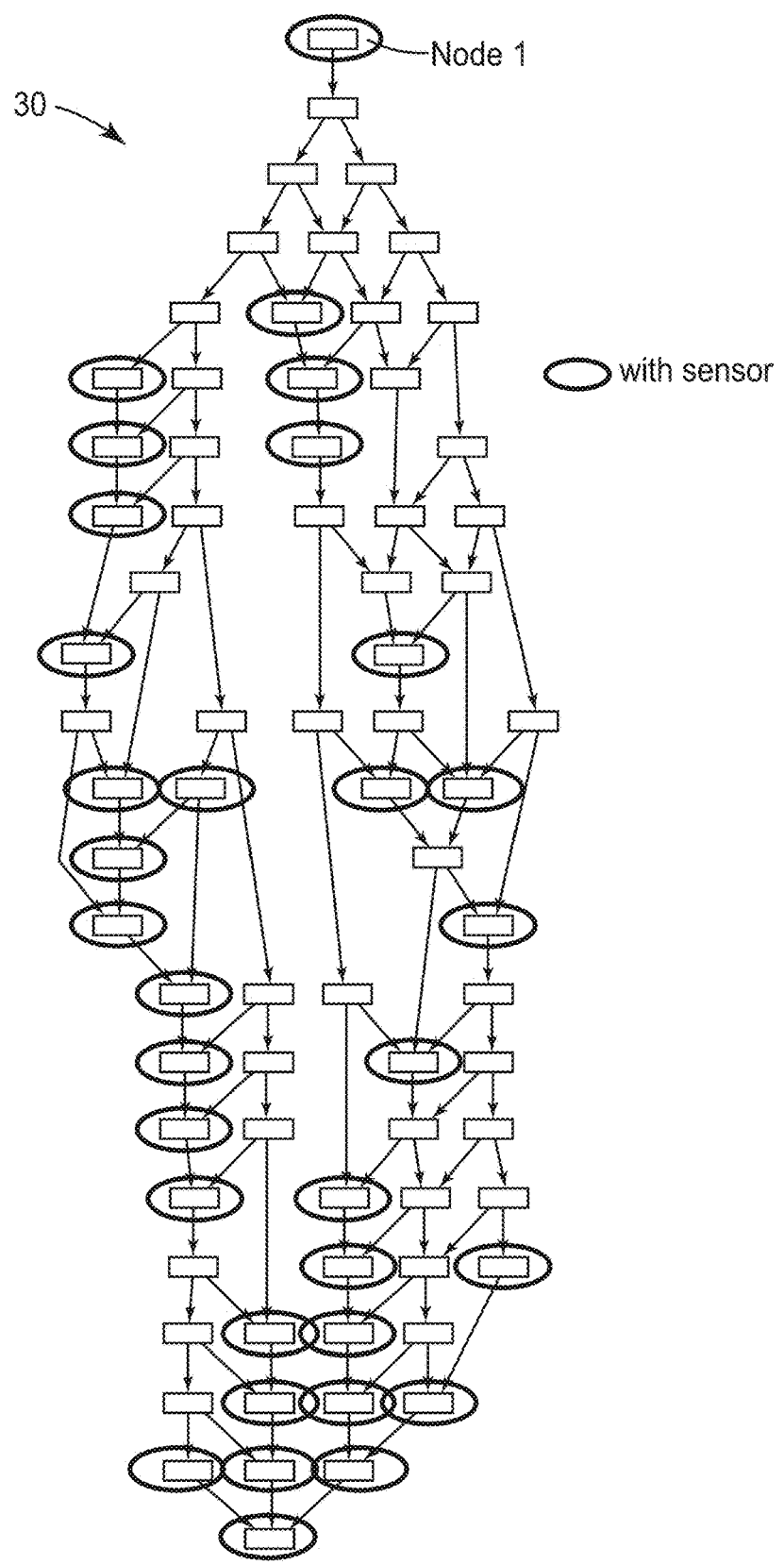
FIG. 5A illustrates a directed graph representing an electrical network with placement of sensors at selected locations, according to an embodiment.
Figure 5B:
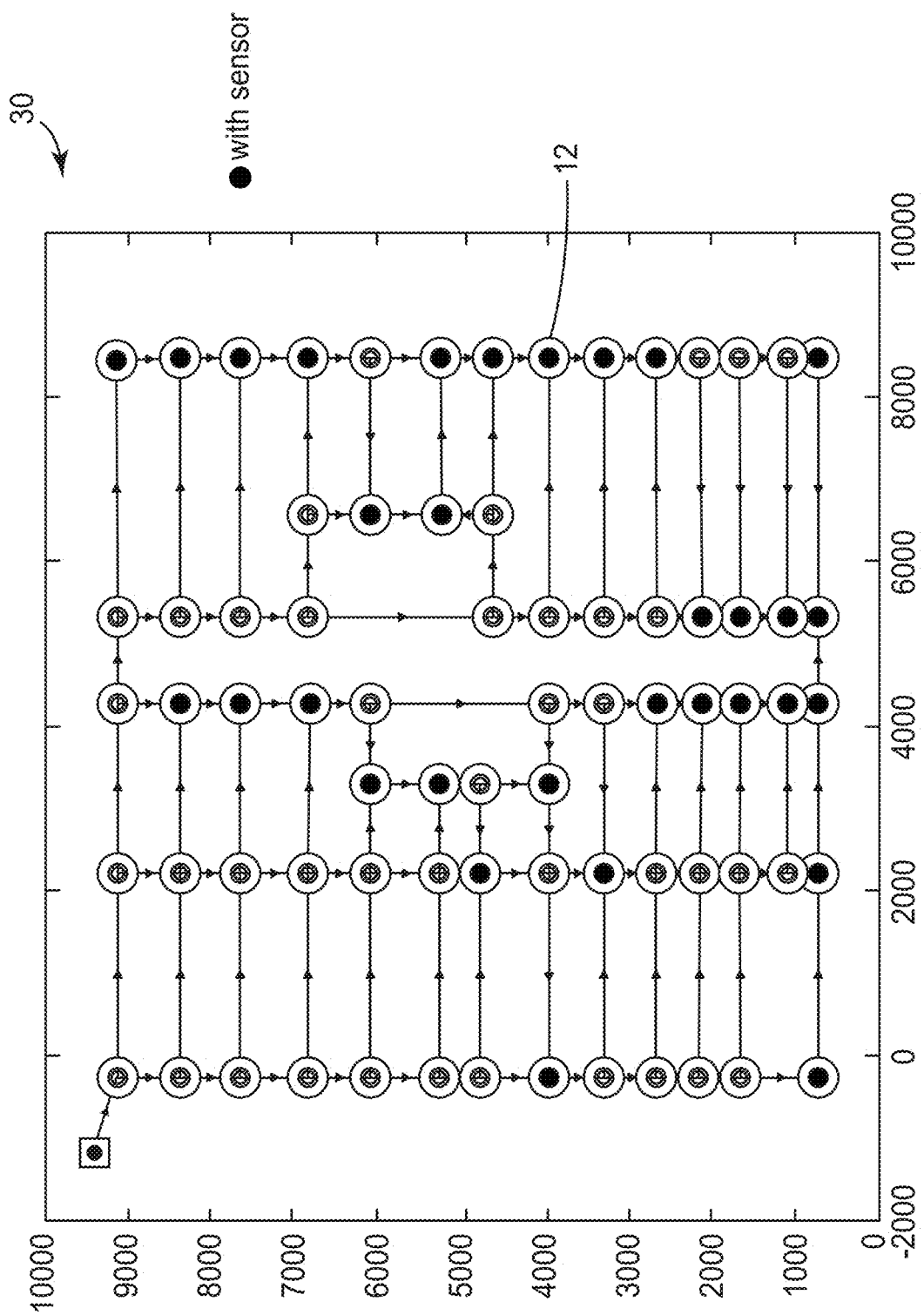
FIG. 5B illustrates a reformatted version of the directed graph of FIG. 5A.

FIG. 5A illustrates a model 30 of an electrical network, according to another embodiment. The electrical network is represented by a directed graph. Node 1 may represent a power supply. The model 30 can be analyzed in a manner similar as shown in FIGS. 4A-D for the model 20, as discussed above. The model 30 includes 74 nodes among which thirty-two nodes do not satisfy the localizability criteria and sensors are provided for the thirty-two nodes (e.g., circled nodes in FIG. 5A) to completely cover the whole electrical network 30. The complexity index of the electrical network 30 of FIG. 5A is 32/74. FIG. 5B illustrates a reformatted version of the directed graph of FIG. 5A provided with sensors at selected locations.

In some embodiments, the nodes of the model 30 can be first grouped into respective node sets before evaluation. FIG. 5C shows that some adjacent nodes are grouped into the same node set 32 (e.g., within the same circle). In this manner, the number of required sensors to completely cover the whole electrical network can decrease from 32 to 15, as compared to FIG. 5B. The tradeoff is that when one specific node set is determined to be the cause of an anomaly, it may not tell the explicit location (e.g., which node) of anomaly within the specific node set.

Figure 5D:
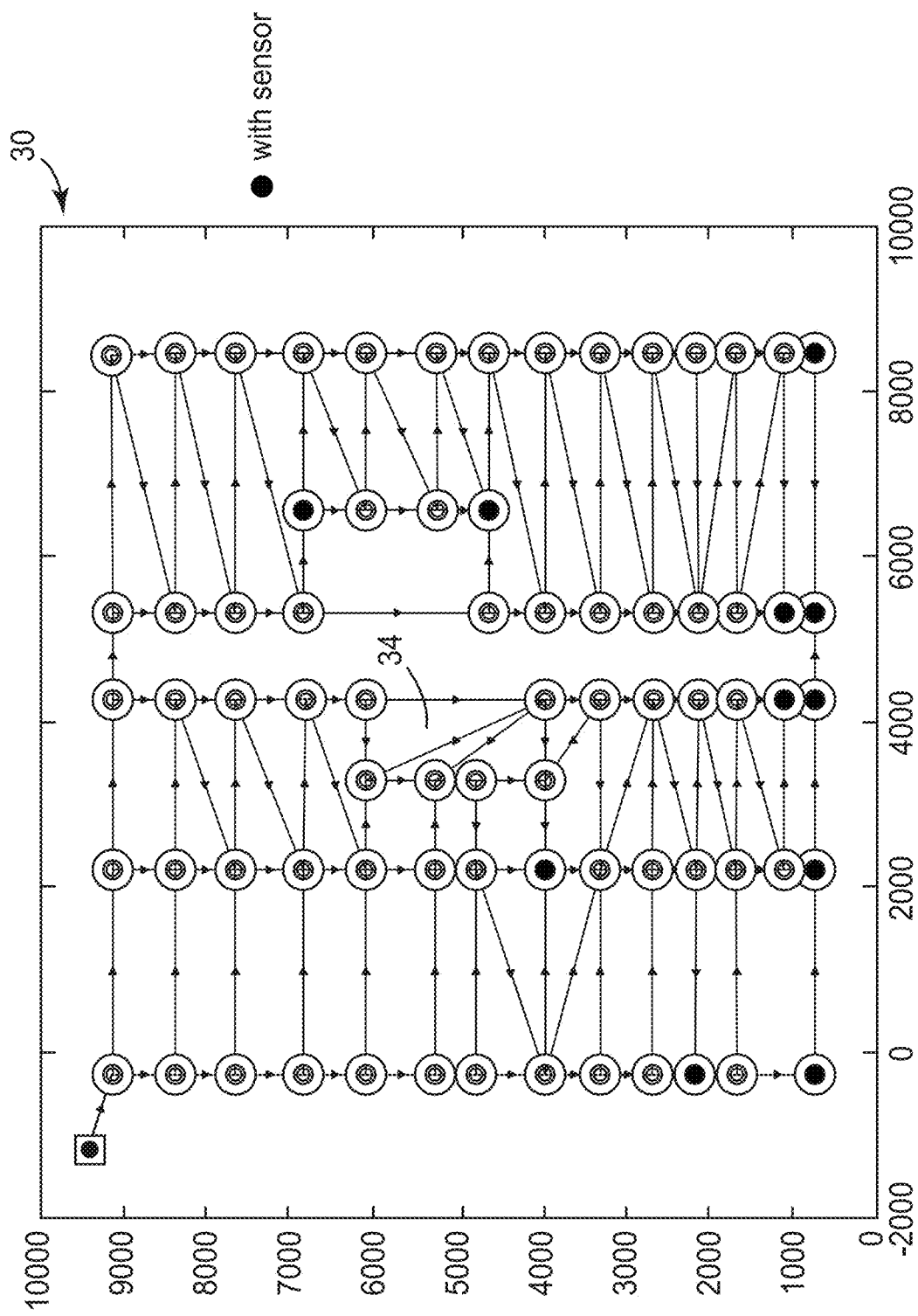
FIG. 5D illustrates a modification of the electrical network of FIG. 5B by adding current paths, according to one embodiment.

In some embodiments, an electrical network can be modified to reduce the number of sensors required for full coverage of the electrical network. As shown in FIG. 5D, one or more connections 34 (e.g., power lines) can be added to directionally connect electrical device infrastructure represented by nodes. When the connections 34 are added in FIG. 5D, the number of required sensors to completely cover the whole electrical network can decrease from 32 to 11, as compared to FIG. 5B.

The present disclosure further provides methods of determining sensor coverage in an electrical network. The methods can include building a model of the electrical network. The model can include directionally connected nodes representing electrical device infrastructure disposed in the electrical network. One or more sensors can be positioned at one or more selected locations in the electrical network. The model or representations of the model can be stored in, for example, a processor. The model or its representation can be analyzed, via the processor, to evaluate whether each node satisfies one or more localizability criteria. The localizability criteria may include, for example, for a given node, evaluating whether there are at least two sensors other than the given node which have the respective paths not sharing any d-separator with respect to the given node.

Based on results of the evaluation, the nodes of the model can be assigned to one of a localization area, a detection area, and an out-of-reach area. A localization area refers to an area in an electrical network where the location of anomaly (e.g., at a specific node) can be explicitly determined. A detection area refers to an area in an electrical network where data/signal related to an anomaly may be detected, but the exact location of the anomaly is unknown. An out-of-reach area refers to an area in the electrical network where no information related to the anomaly can be obtained. When a given node satisfies the localizability criteria, the given node is assigned to the localization area, and when the given node does not satisfy the localizability criteria, the given node is assigned to the detection area or the out-of-reach area.

When the given node does not satisfy the localizability criteria, the given node can be further evaluated to determine whether a sensor is located at or away from the given node. If there are no sensors, the area corresponding to the given node is assigned to the out-of-reach area, otherwise it is assigned to the detection area.

In some embodiments, evaluation of paths between the given node and other nodes can be performed by using suitable algorithms regarding reachability of such as an advanced Markov chain method. An exemplary Markov chain method was described in Golnari et al., "Pivotality of Nodes in Reachability Problems Using Avoidance and Transit Hitting Time Metrics," 7th Annual Workshop on Simplifying Complex Networks for Practitioners SIMPLEX 2015, May. 2015, which is incorporated herein by reference in its entirety. It is to be understood the evaluation of paths can be performed by any other suitable algorithms.

In some embodiments, the sensitivity of sensors (e.g., sensitivity on measuring anomalous electrical parameters) and an absorption (hitting) probability matrix Q can be analyzed to determine a minimum detectable change in power, current, or voltage level for at least some of the nodes. The absorption (hitting) probability matrix Q of an electrical network will be described further below.

Figure 6A:
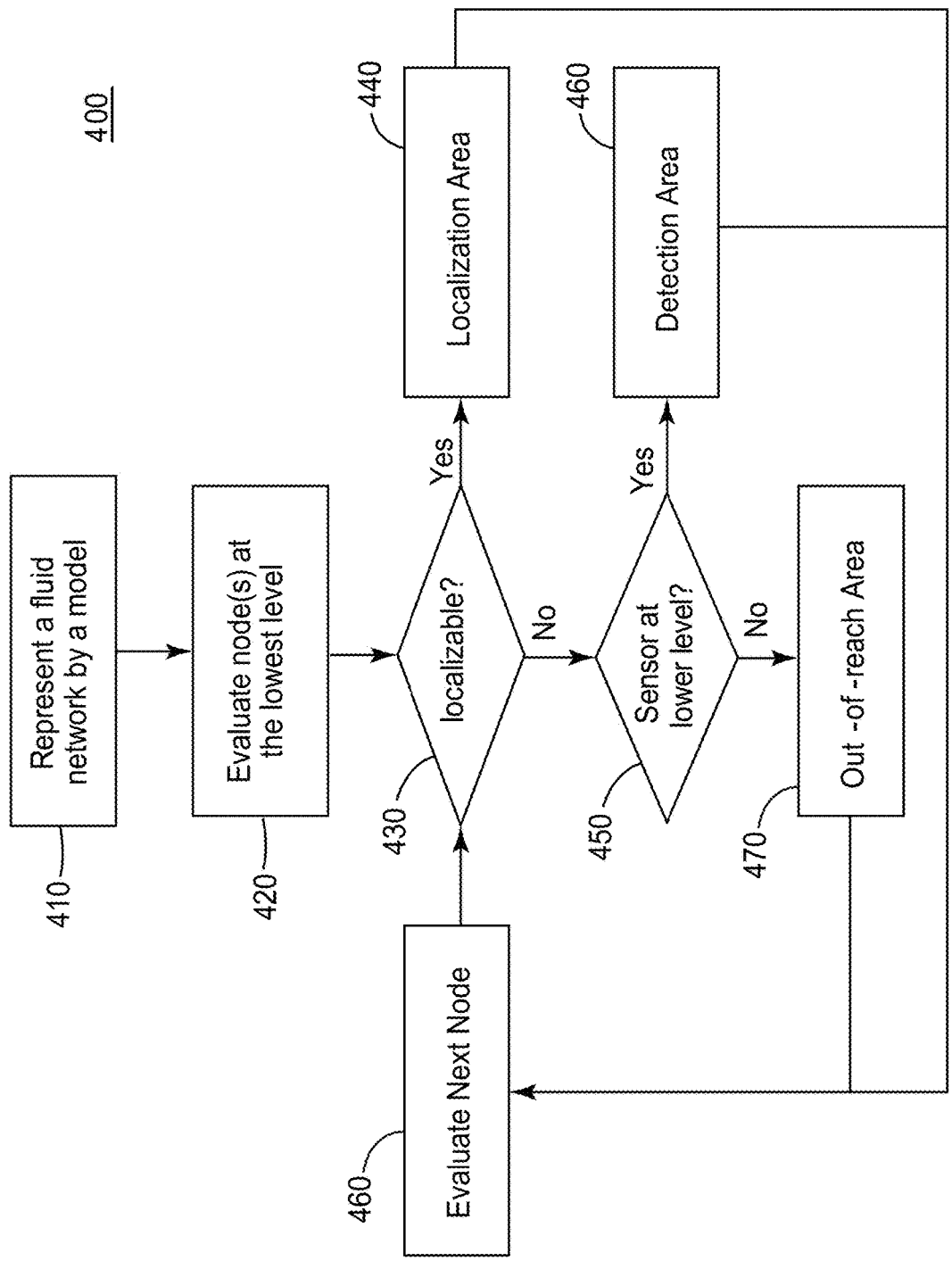
FIG. 6A illustrates a flow diagram of a method of determining sensor coverage in an electrical network, according to one embodiment.

FIG. 6A is a flow diagram of a method 400 for determining sensor coverage in an electrical network, according to one embodiment. At 410, an electrical network is represented by a model. The model can be, for example, a directed graph such as the directed graph 20 shown in FIG. 4A, or for bidirectional flow it can be graphs such as those shown in FIG. 14 and FIG. 16. The method 400 then proceeds to 420. At 420, one or more nodes of the model are evaluated with respect to the sensor nodes to determine at 430 whether the node or node set satisfies localizability criteria, e.g., whether there are at least two sensors other than the given node or node set which have the respective paths not sharing any d-separator with respect to the given node or node set.

When the node or node set satisfies the localization criteria, the method 400 proceeds to 440. When the node or node set does not satisfy the localizability criteria, the method 400 proceeds to 450. At 440, the node or node set is assigned to a localization area. The method 400 then proceeds to 480.

At 450, the node or node set is further evaluated to determine there are detectable sensor(s) at the node or node set or at other node(s). When there is a sensor located at or downstream of the node or node set, the method 400 proceeds to 460. At 460, the node or node set is assigned to a detection area. When there are no sensors located at or downstream of the node or node set, the method 400 proceeds to 470. At 470, the node or node set is assigned to an out-of-reach area. The method 400 then proceeds to 480.

At 480, next mode or mode set at the same level or an upper level in the model is evaluated in the same manner. The process continues until the node(s) at the upper most level of the electrical network is evaluated.

Figure 6B:
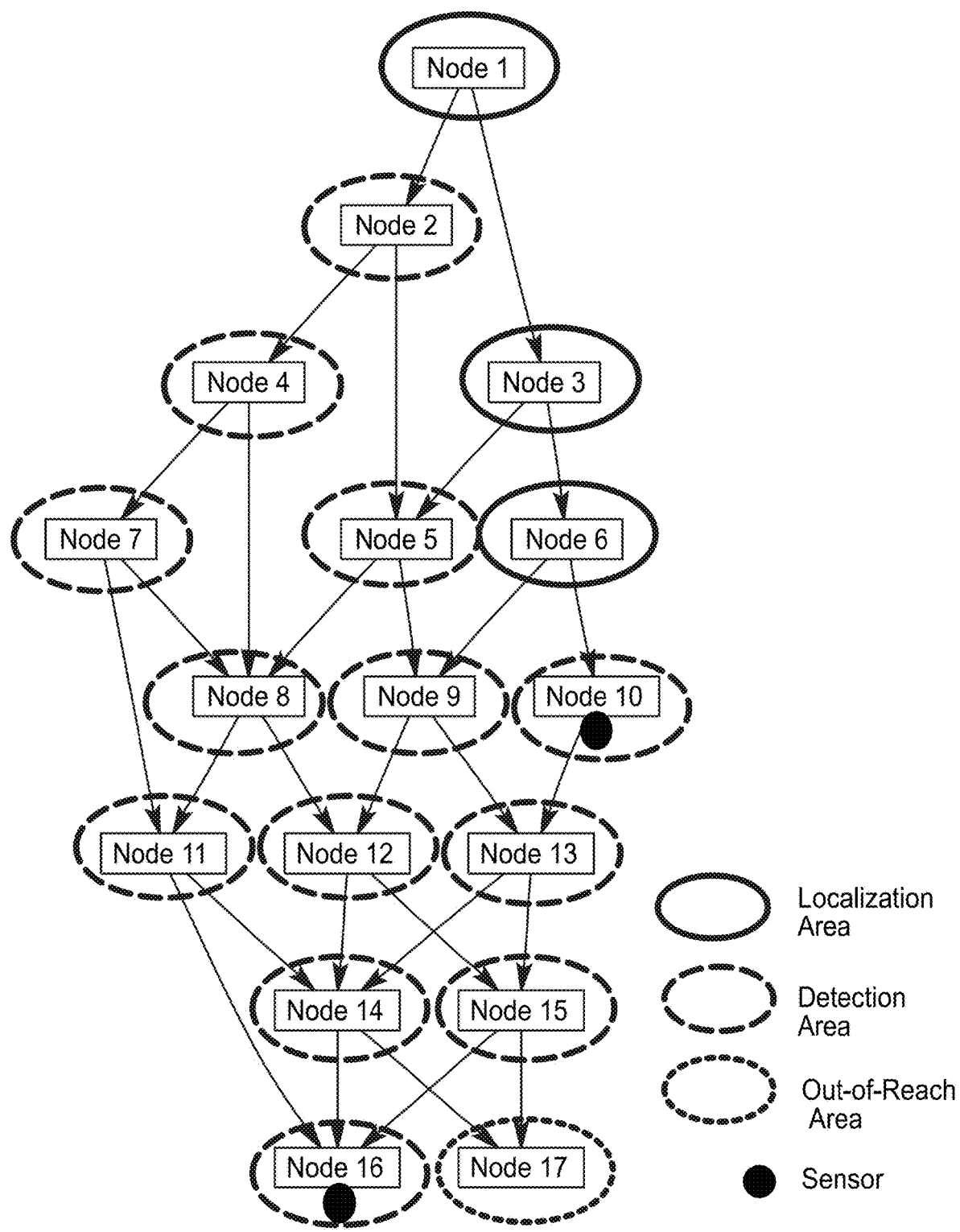
FIG. 6B illustrates a diagram of an electrical network divided into a localization area, a detection area, and an out-of-reach area, according to one embodiment.

By applying the method 400 of FIG. 6A to an electrical network represented by the model 20 of FIG. 4A, the results are shown in FIG. 6B. As shown in FIG. 6B, sensors are provided to nodes 10 and 16, respectively. The evaluation starts from the lowest level, e.g., node 16 or 17 in the directed graph 20. It is found that node 16 do not satisfy the localizability criteria. There are no sensors downstream of node 16. Node 16 is further evaluated to determine whether there is a sensor at or downstream of node 16. There is a sensor located at node 16. Node 16 is assigned to a detection area. Nodes 17 is evaluated in the same manner. It is found that node 17 do not satisfy the localizability criteria. There are no sensors downstream of node 17. Node 17 is further evaluated to determine whether there is a sensor at or downstream of node 17. There is no sensor located at or downstream of node 17. Node 17 is assigned to an out-of-reach area. Then, node 14 or 15 at the next level can be evaluated. It is found that nodes 14 and 15 do not satisfy the localizability criteria. There is only one sensor downstream at node 16. Nodes 14 and 15 are assigned to a detection area, respectively. This bottom-up approach continues and each node can be evaluated. It is found that nodes 1, 3 and 6 each satisfy the localizability criteria and assigned to a localization area. For example, for node 3, one path from node 3 to the sensor at node 16 through 3-5-9-12-14-16 and one path from node 3 to another sensor at node 10 through 3-6-10 do not share any d-separator, and node 3 satisfies the localizability criteria. Other nodes are assigned to a detection area. With sensors being placed at nodes 10 and 16, the electrical network 20 is partially covered, and divided into the localization area, the detection area, and the out-of-reach area. By analyzing the data from the sensors located at node 10 and 16, a processor of a detection system can (i) explicitly determine the location of anomaly if the anomaly source is within the localization area, and (ii) detect the occurrence of an anomaly if the anomaly source is within the detection area.

Figure 6C:
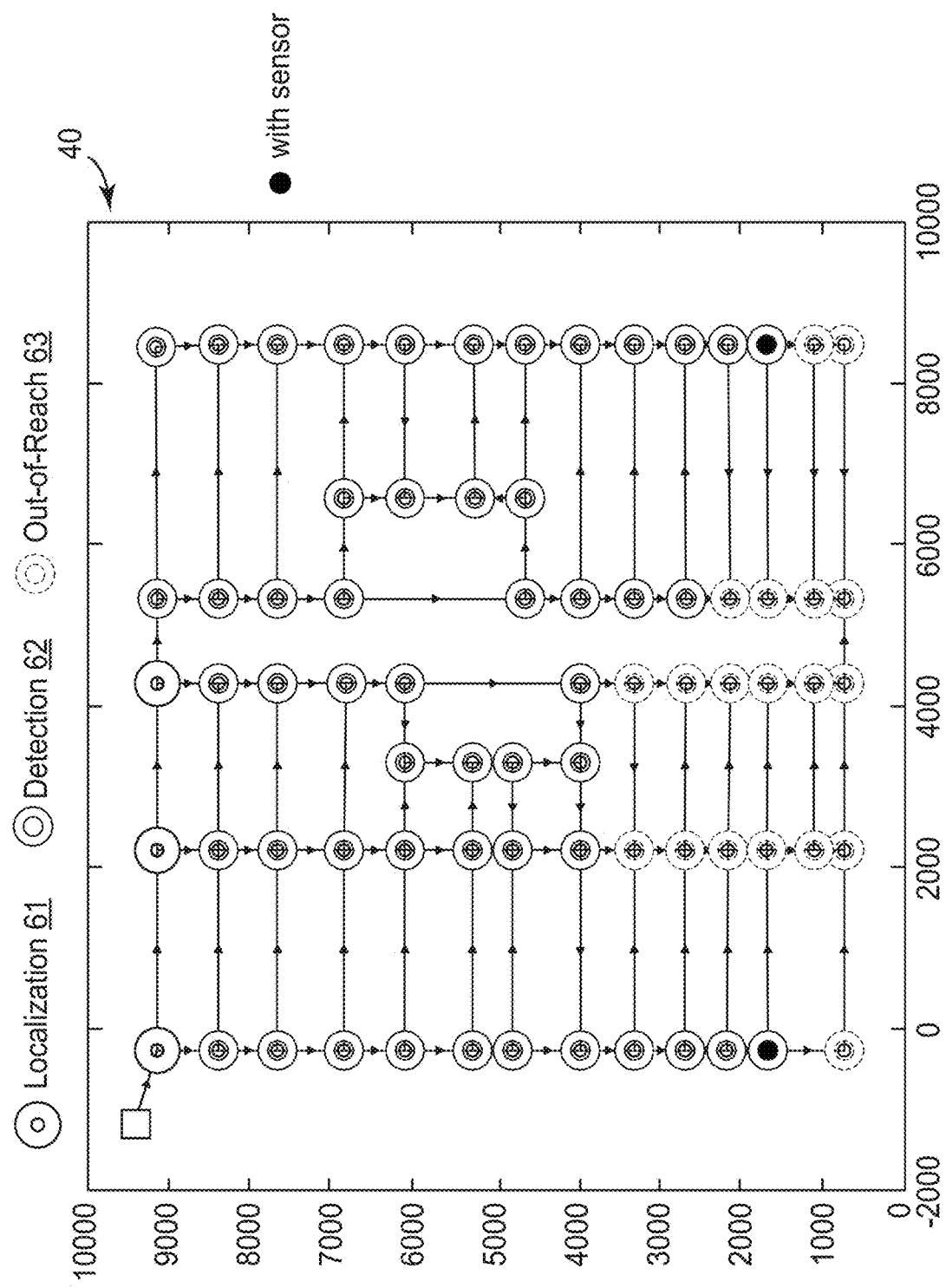
FIG. 6C illustrates a diagram of an electrical network divided into a localization area, a detection area, and an out-of-reach area, according to another embodiment.

FIG. 6C illustrates a diagram of a model 40 where the nodes are assigned to a localization area 61, a detection area 62, and an out-of-reach area 63, respectively, according to one embodiment. The model 40 of FIG. 6A are the same as the model 30 of FIG. 5B except that the number of sensors and their locations are different. Sensors are provided for the electrical network in FIG. 5B such that the whole electrical network is completely covered, while in FIG. 6C, the electrical network is partially covered and the nodes are assigned to one of a localization area, a detection area, and an out-of-reach area.

Figure 6D:
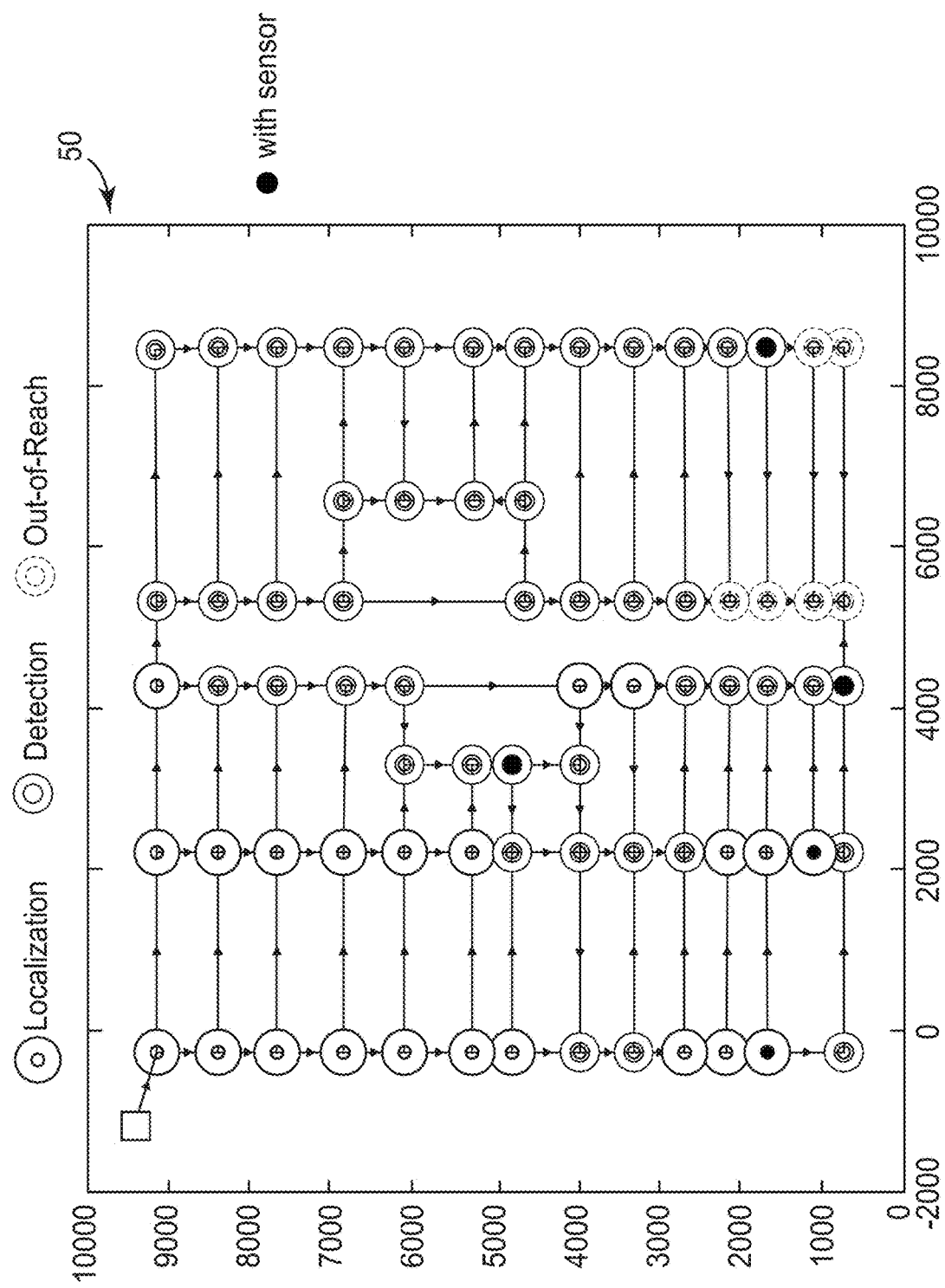
FIG. 6D illustrates a diagram of an electrical network divided into a localization area, a detection area, and an out-of-reach area, according to yet another embodiment.

FIG. 6D illustrates a diagram of a model 50 where the nodes are assigned to a localization area 61, a detection area 62, and an out-of-reach area 63, respectively, according to another embodiment. The model 50 of FIG. 6B is the same as the model 40 of FIG. 6C except that the number of sensors and their locations are different. In FIG. 6D, the electrical network is partially covered and the nodes are assigned to one of a localization area, a detection area, and an out-of-reach area. As compared to FIG. 6C, when the number and/or location of sensors change, the assignment of the nodes to different areas is changed accordingly.

The present disclosure further provides methods of detecting and localizing an anomaly of interest in an electrical network. The methods can determine the level of the anomaly and its location (e.g., at which node of the electrical network) when the anomaly occurs within a localization area of the electrical network. The methods can further detect the occurrence/existence of anomalies at other nodes (e.g., nodes in a detection area of the electrical network) and identify the locations at high risk within the electrical network.

The methods may include, for example, providing one or more sensors disposed at one or more selected locations in the electrical network. The sensors are configured to collect data from the electrical network at the respective locations. Data can be collected, via the one or more sensors, from the electrical network at the one or more locations on which the one or more sensors are disposed. The collected data can include sensor measurements before and after an anomaly has occurred. The data can then be received from the sensors, and analyzed, via the processor, based on a model of the electrical network. The model can include directionally connected nodes. In some embodiments, one or more imaginary nodes can be added between two adjacent nodes to generate a harmonic function of absorbing states based on the model.

In the case of electrical networks, Kirchhoff Current Law (KCL) and Kirchhoff Voltage Law are fundamental techniques for solving the current or voltage values at a node. KCL provides that the net sum of current for each node is zero (current is a signed (positive or negative) quantity reflecting direction towards or away from a node): $\Sigma I=0$. KVL provides that the net sum of voltages over a loop is zero: $\Sigma V=0$. One way to model it is to model an illegitimate load as an unknown resistance added to a node. Its value and location are unknown.

To demonstrate the application of electricity theft, voltage may be used as a metric to model a harmonic function in a network modeled as a Markov chain. In such network, states represent the nodes and transitions occur through network links. The power source and the ground are modeled as absorbing states. A transition probability matrix of states is computed from adjacency matrix (consisting of link resistors and node connection):

$$P = D^{-1} A_j$$

The fundamental matrix computation and hitting probability derivation is as follows:

Matrix P is partitioned to four parts:

$$\begin{bmatrix} P_{II} & P_{IB} \\ P_{BI} & P_{BB} \end{bmatrix},$$

Where I represents interior and B represents boundary. Note that $P_{BI}$ is a matrix of all zeros and $P_{BB}$ is an identity matrix. Fundamental matrix and hitting probabilities are computed from P:

$$N = (I - P_{II})^{-1}, \quad Q = N P_{IB}$$

A detection algorithm compares the model-based data (hitting probability Q) against the real sensor data (sensing voltage) and if the difference is larger than some threshold, an anomaly is identified.

The localization algorithm (back propagation and estimation method) provides that the absorption (hitting) probability by the new absorbing node $s_2$ can be found from the fundamental matrix belonging to the case when only node $s_1$ was absorbing:

$$Q_i^{s_2, \overline{s_1}} = \frac{N_{is_2}^{s_1}}{N_{s_2 s_2}^{s_1}}$$

There is no need to computing a new matrix inverse for any candidate of new absorbing node.

The superposition law (a modified version) provides that the value of node i, i.e. $C_i^{after}$, when node $s_1$ and $s_2$ are both boundary nodes with values $C_{s_1}$ and $C_{s_2}$, is equal to its value when only node $s_1$ was the boundary node plus to its value when both $s_1$ and $s_2$ are boundary nodes but with values 0 and $C_{s_2}^{after} - C_{s_2}^{before}$ respectively.

The following formulation is derived based on the superposition law and the lemma:

$$C_{sensor}^{after} = C_{sensor}^{before} + (C_{source}^{after} - C_{source}^{before}) p\,(sensor, source),$$

Where $$p(sensor, source) = Q_{sensor}^{source, \{ground\}}.$$

Only one matrix inverse for the whole process is required $$(N^{\overline{ground}}).$$

$C_{source}^{after}$ is found from the Least Squares Method.

Cascade prediction can be accomplished by (1) once the source of anomaly and its value is estimated, (2) it is added to the Markov model as a new absorbing state and the whole computations in the fundamental matrix computation and hitting probability derivation (above) are repeated to estimate the voltage level of the other non-observing nodes (to identify the locations in high impact or huge voltage drop).

For cases that have some extra effects in the network that no metric is harmonic, an imaginary node is added to network to model the extra effect and make the formulations harmonic (but which is not needed for an electricity theft example as demonstrated herein).

Figure 7:
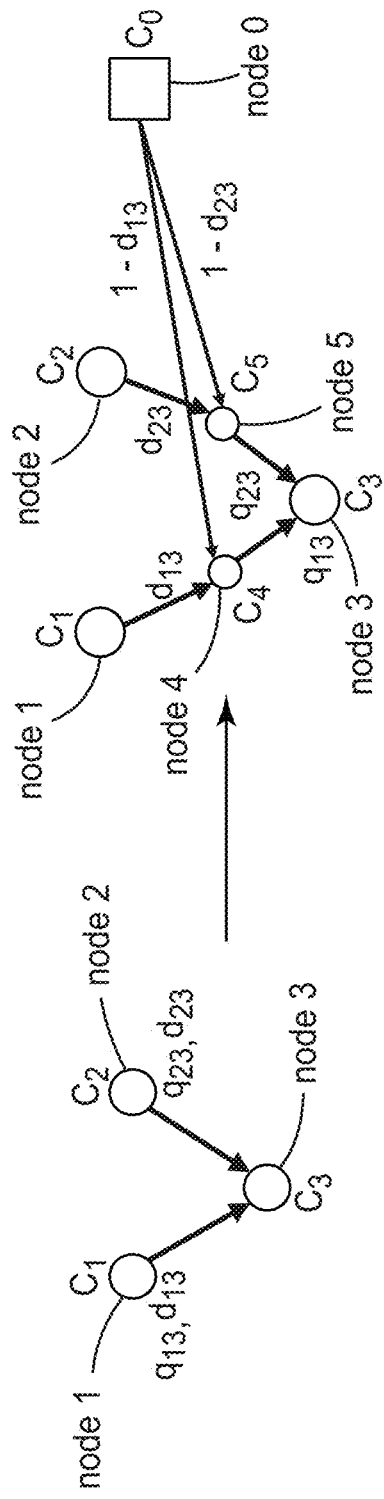
FIG. 7 illustrates a directed graph representing an electrical network modified by adding imaginary nodes, according to one embodiment.

FIG. 7 illustrates a method of modeling an electrical network by adding imaginary or decay nodes, according to one embodiment. The model of the simplified electrical network having an electrical directional aspect includes nodes 1 and 2 directionally connected to node 3. Imaginary nodes 4 and 5 are added between the nodes 1 and 3, and the nodes 2 and 3, respectively. Without the imaginary nodes, the electrical directional aspect can be expressed by:

$$C_3=(q_{13}d_{13}C_1+q_{23}d_{23}C_2)/(q_{13}+q_{23}) \quad (1a)$$

where $C_i$ is the electrical directional aspect at node i, $q_{ij}$ is an electrical flow rate from node i to j, $d_{ij}$ is an electrical directional aspect decay parameter from node i to j.

The above equation (1a) is not harmonic, and there may be no-existing, not unique, or inefficient solutions.

By adding the imaginary nodes (e.g., nodes 0, 4 and 5), the electrical directional aspect levels (e.g., the level of power loss due to theft) at the real nodes (e.g., nodes 1-3) of the electrical network can be calculated as one or more harmonic functions. The power loss decay, d, is set to zero at imaginary node 0. Then, for example, $C_4$ may be represented as:

$$C_4=(C_1d_{13}+C_0(1-d_{13}))/d_{13}+(1-d_{13}) \quad (1b)$$

Which can then reduce to the harmonic function:

$$C_4=C_1d_{13} \quad (1c)$$

This formulation may then be derived for the remaining nodes to gain a harmonic diffusion model. Given this harmonic diffusion model, and following Dirichlet's principle, the anomaly level of all real nodes may be found when the level of the anomaly (e.g., power loss level) at the sources (originating node and any nodes with a sensor) is known.

The power loss level at the imaginary or decay nodes can be set to be about zero. In some embodiments, when the location and amount of a power loss are determined, the power loss levels at other nodes (e.g., nodes in a detection area of the electrical network) of the electrical network can be calculated by:

$$C_{interior}=QC_{boundary} \quad (2)$$

where $C_{interior}$ is the vector of power loss levels of all nodes except for the site of the power loss, $C_{boundary}$ is the vector of power loss level at the power loss site, and Q is an absorption (hitting) probability matrix which can be determined by a transition probability matrix. The transition probability matrix can be determined from an adjacency matrix constructed from weights, representative of power flow and power loss decay in the electrical network. The transition probability matrix is further partitioned to represent interior and boundary sources. The absorption probability matrix, Q, can be solved for a specific electrical network by one skilled in the art.

In some embodiments, a model of electrical network with imaginary nodes can be used to determine the location of one or more power loss sources based on data collected by sensors at some nodes, which can be further used to estimate power loss levels at other nodes and/or identify locations of failure in high risk.

In some embodiments, for a relatively simple electrical network, the location of a source of power loss can be determined by individually considering each node as a boundary node with an assumed anomaly level as potential source (of the loss), and comparing these modeled values to the sensor measurements. For relatively complex electrical networks, this method may be difficult to implement due to the complexity of the network.

In some embodiments, the location of a power loss can be determined by placing at least two sensors at downstream locations of the electrical network, analyzing data from the sensors before and after an anomalous event, and modeling the initial, non-anomalous state of a node. An absorption probability matrix and the level at the anomaly source can then be obtained using a fitting estimation method, such as, a Least-Squares Method, which is known in the art.

In some embodiments, data from the sensors can be analyzed to compute the level of power loss at nodes within a detection area of the electrical network. The methods of assigning nodes to a detection area has been discussed above. See, for example, FIG. 6B. The power loss levels at the nodes can be computed by determining an absorption probability matrix Q. The data can be further analyzed to localize one or more potential power loss sources based on the computed level of power loss at the nodes. Based on the information of the potential power loss sources, power loss levels at other nodes in the electrical network can be further estimated.

Figure 8A:
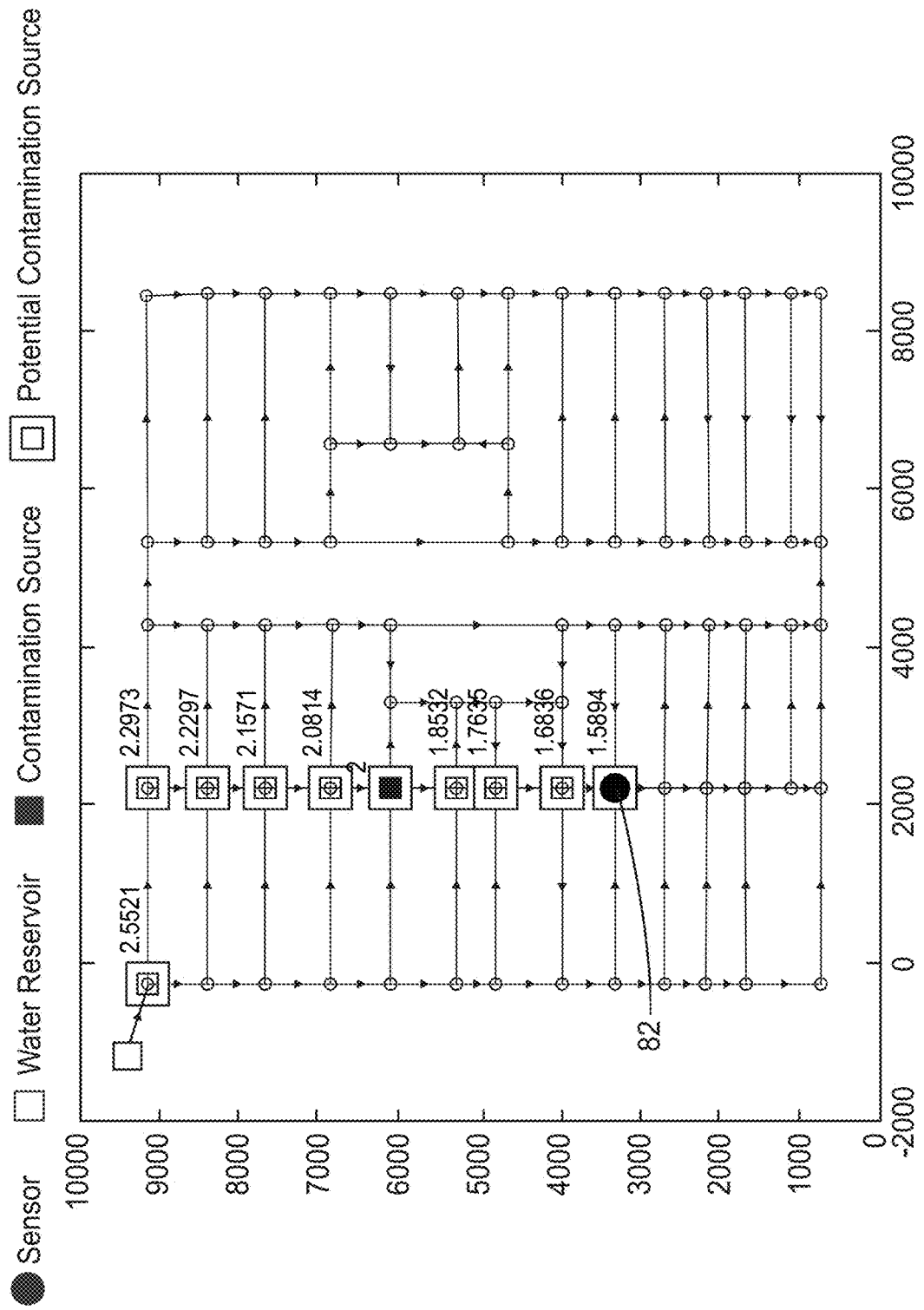
FIG. 8A illustrates a model of an electrical network to determine a potential electricity theft node, according to one embodiment.
Figure 8B:
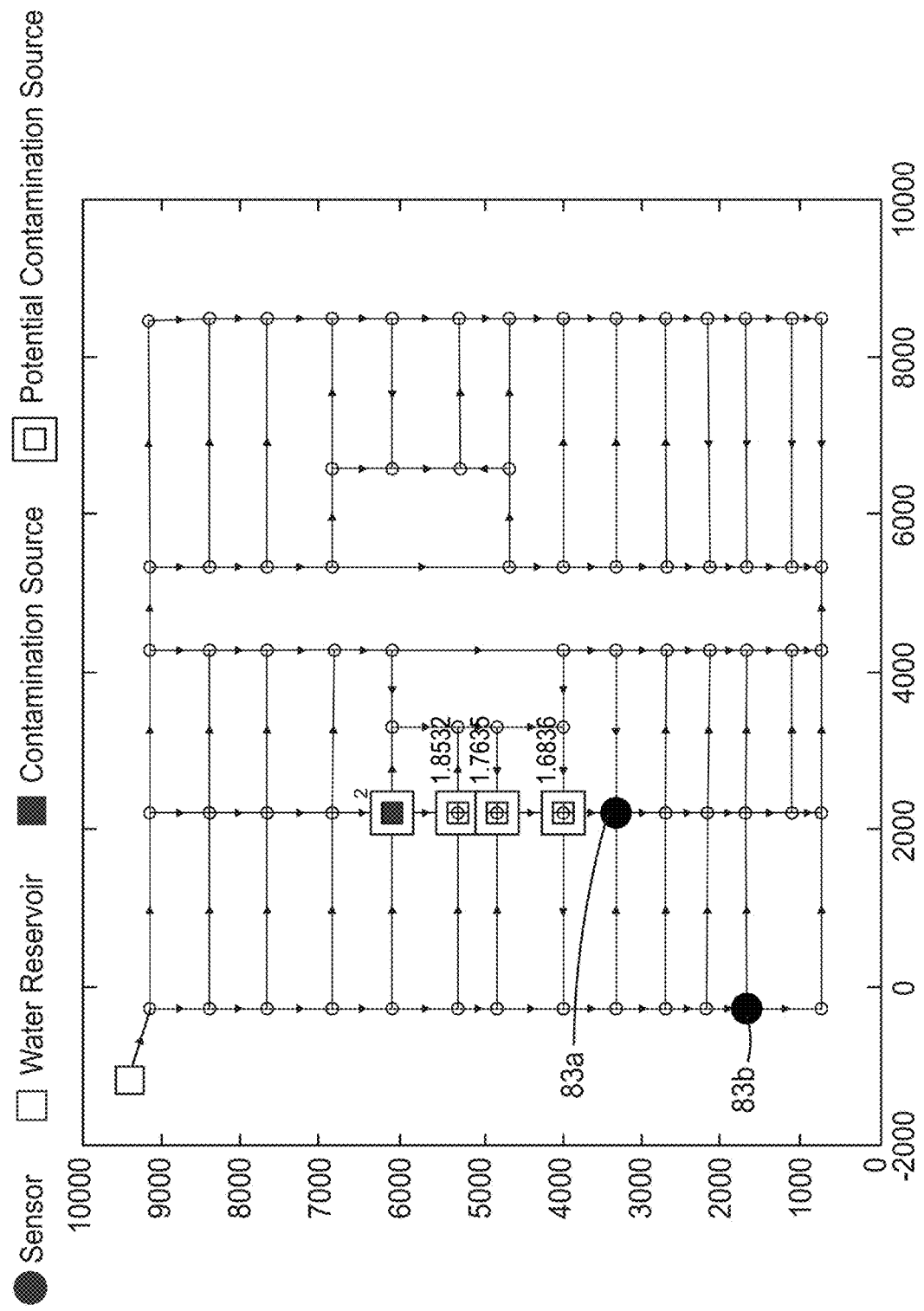
FIG. 8B illustrates a model of an electrical network to determine potential electricity theft node, according to another embodiment.
Figure 8C:
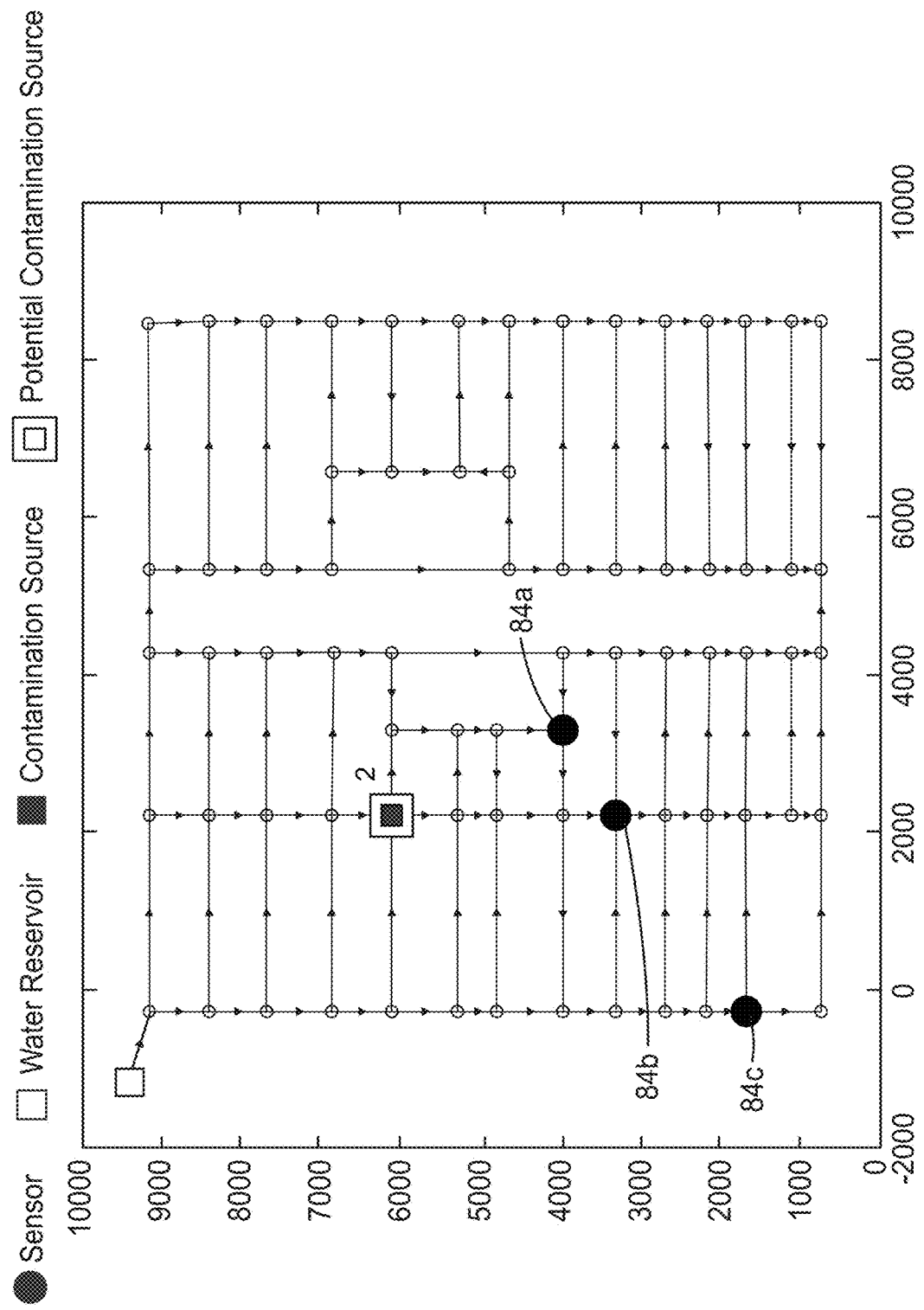
FIG. 8C illustrates a model of an electrical network to determine potential electricity theft node, according to another embodiment.

FIGS. 8A-C illustrate how to determine the location of power loss sources with varying amounts of sensors in an electrical network. In FIG. 8A, one sensor is located at node 82 and the power loss level is measured at the node 82. Using the model and power loss localization method discuss above, the nodes of the electrical network can be respectively assigned to a localization area, a detection area, and an out-of-reach area. The power loss levels for the nodes within the detection area can be calculated to determine potential power loss source(s). In this case, ten nodes (e.g., nodes with a square in FIG. 8A) are identified as potential anomalous sources, and are labeled with their respective power loss levels. In FIG. 8B, two sensors are located at nodes 83a and 83b, respectively. Similarly, the power loss levels for the nodes within the detection area can be obtained. In this case, four nodes have been identified as a potential sources of power loss, and are labeled with their respective power loss levels. In FIG. 8C, three sensors are located at nodes 84a, 84b and 84c, respectively. In this case, the location of source of power loss is determined to be at node 88. In FIGS. 8A-B, a power loss associated with a subset of localized nodes can be determined based on the calculated power loss levels and sensor(s) locations, while in FIG. 8C, the described method can exactly localize the node with the source of the power loss.

Figure 9A:
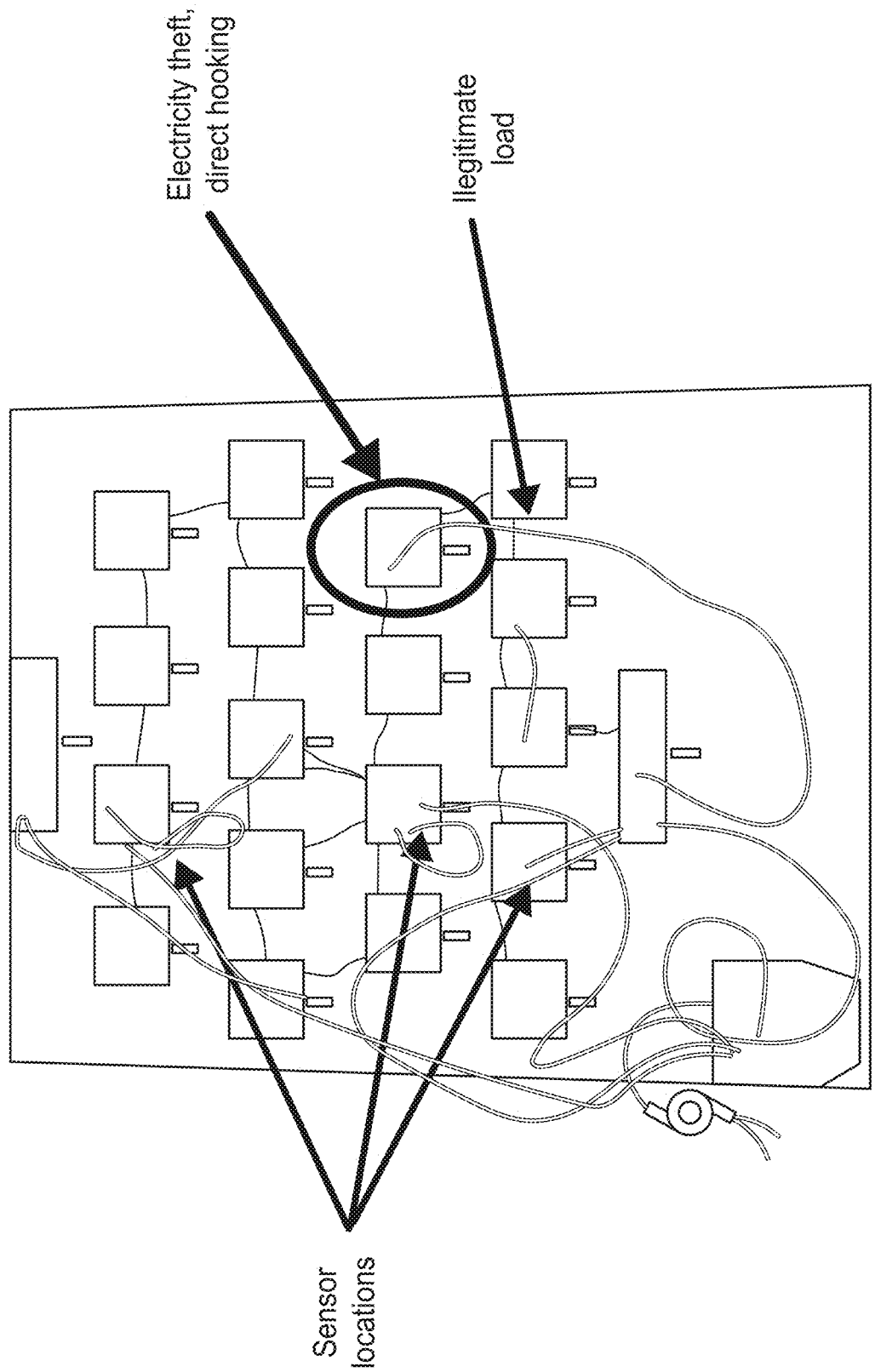
FIG. 9A illustrates a physical model of a multiple node electrical network to demonstrate the subject matter of the present disclosure.
Figure 9B:
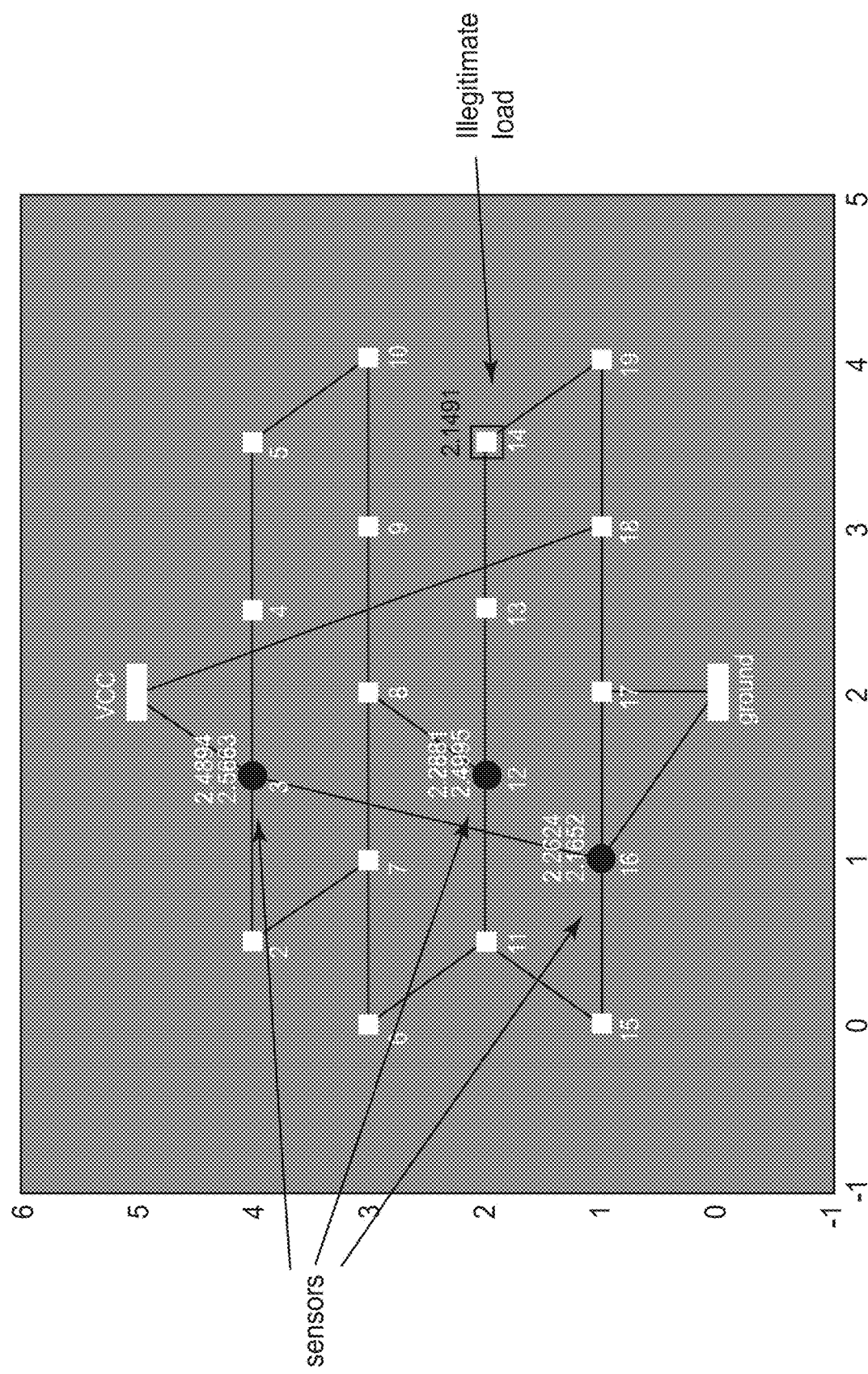
FIG. 9B illustrates a digital twin model of the multiple node electrical network of FIG. 9A.
Figure 10:
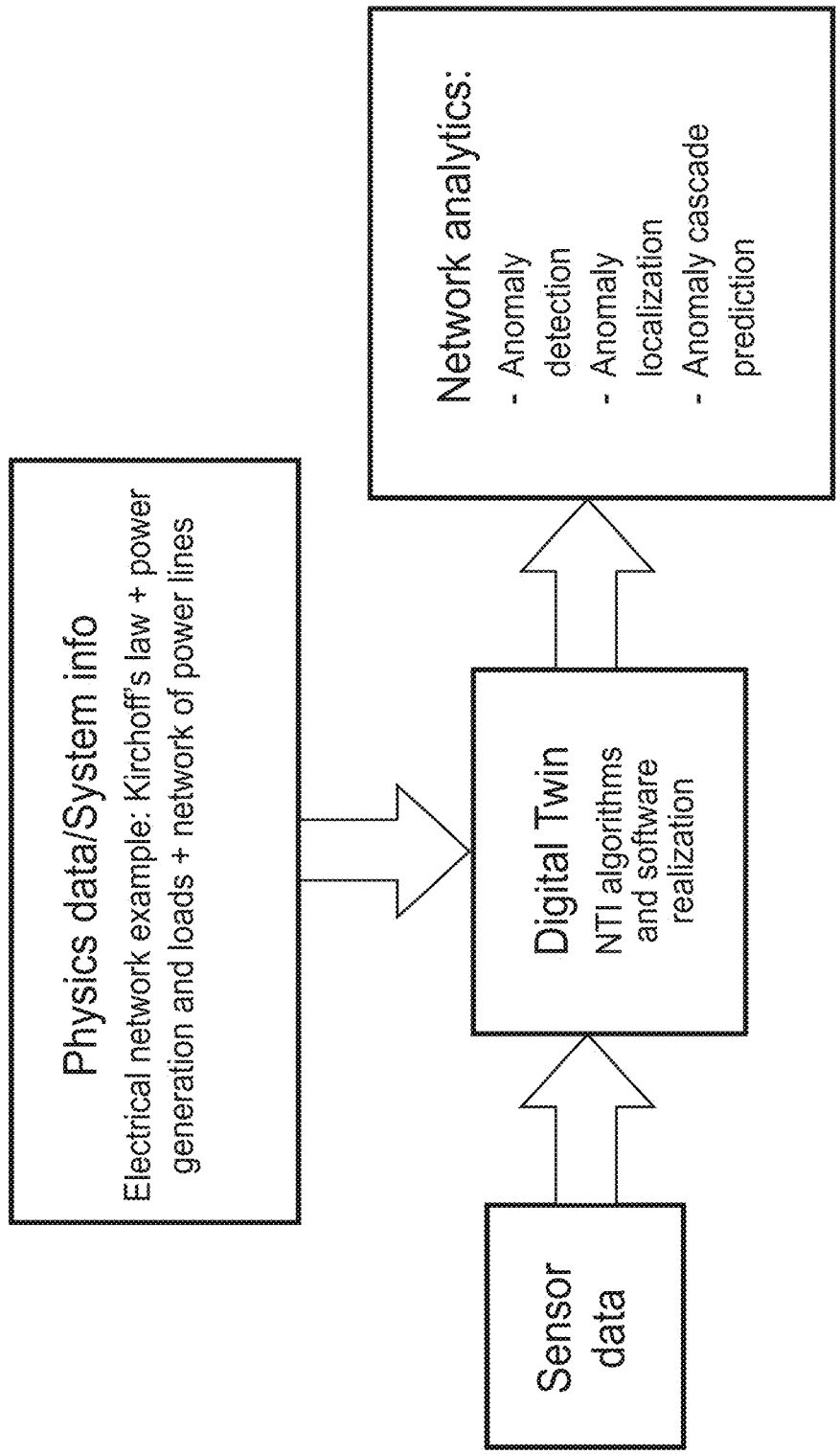
FIG. 10 is a block diagram of the inputs and outputs of the digital twin model of FIG. 9B, according to an embodiment.

FIG. 9A illustrates a physical model of a multiple node electrical network to demonstrate the subject matter of the present disclosure. In the physical model power distribution is measured over the three sensor locations. Electricity theft is modeled as connecting an illegitimate load to one of the nodes in the network. The present anomaly detection approach can be used to localize the site of the illegitimate load (theft) using the three sensors using a digital twin model. FIG. 9B illustrates a digital twin model of the multiple node electrical network of FIG. 9A. The resulting model of the system shows which nodes the sensors are located at and where the illegitimate load is located using the algorithm according to this example of one embodiment of the present subject matter. FIG. 10 is a block diagram of the inputs and outputs of the digital twin model of FIG. 9B, according to an embodiment. System information, such as node-to-node connectivity (e.g., an adjacency matrix), and source node identification (e.g., power, VCC) and voltage information are some possible inputs for voltage measurement applications. The sensor data is input with the system information to the digital twin which executes software to perform network analytics. The resulting network may produce, in various embodiments and combinations, one or more of: detection of an anomaly, localization of a detected anomaly, and/or anomaly cascade prediction. Other variations of detections are possible without departing from the scope of the present subject matter.

Figure 11A:
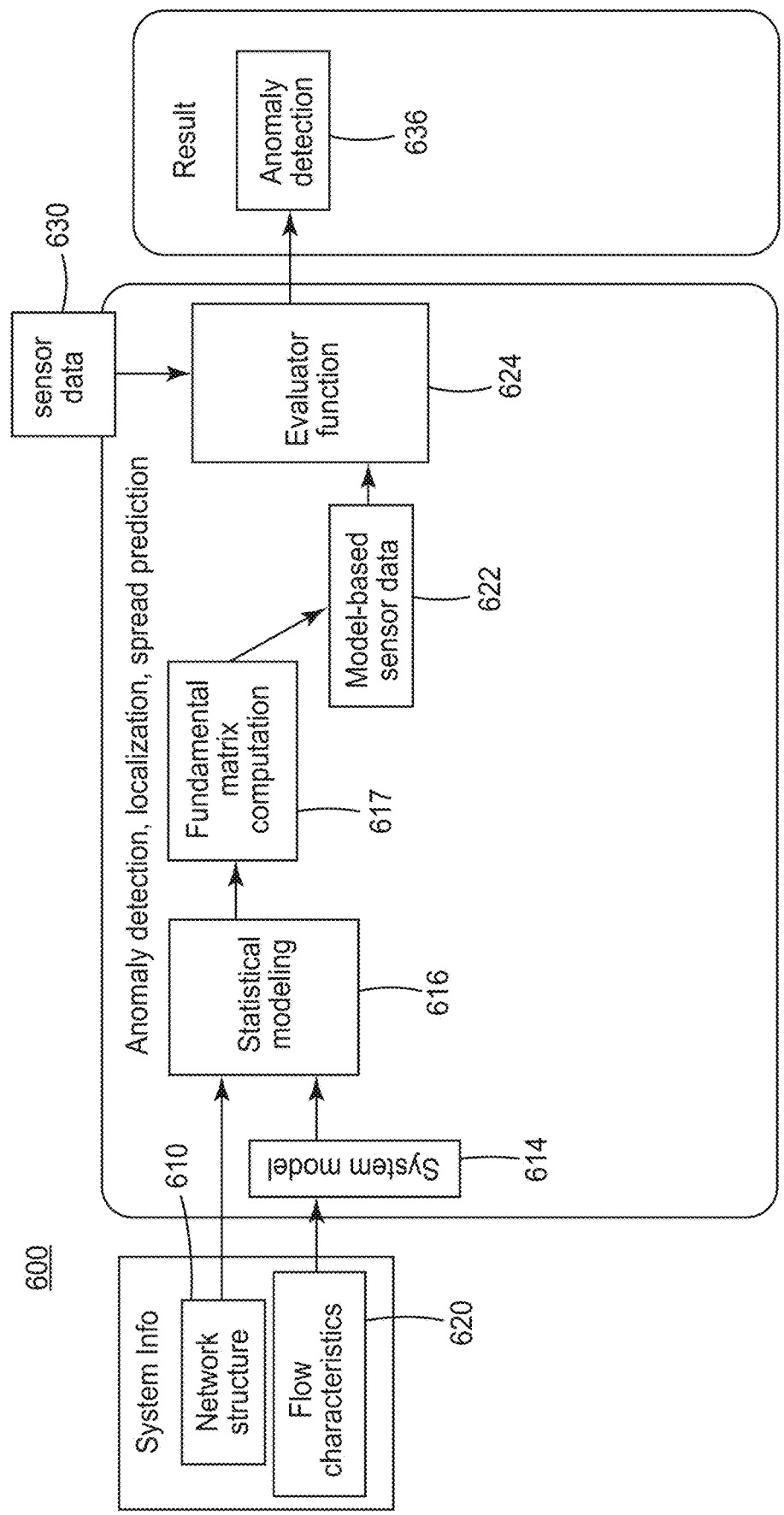
FIG. 11A is a flow diagram of the system for anomaly detection of an electrical network using statistical modeling, according to an embodiment.

FIG. 11A is a flow diagram of the system for anomaly detection of an electrical network using statistical modeling, according to an embodiment. Processing system 600 receives network structure information 610 and flow characteristic information 620 to generate a system model 614 and perform statistical modeling 616 and matrix computation 617. An example of flow characteristic information for fundamental matrix computation includes Kirchhoff's Current Law (KCL) and Kirchhoff's Voltage Law for solving the current or voltage values at a node:
  a. KCL: the net sum of current for each node is zero (current is a signed (positive or negative) quantity reflecting direction towards or away from a node): $\Sigma I=0$.
  b. KVL: the net sum of voltages over a loop is zero: $\Sigma V=0$.

In such cases, an illegitimate load is modeled as an unknown resistance added to a node. Its value and the location is unknown.

The resulting matrix computations are modified using model-based sensor data 622 and evaluated using sensor data 630 by evaluator function module 624. The result provides an indication of detection of an anomaly 636 (e.g., electricity theft), according to an embodiment. The system 600 can detect an anomaly in the electrical network given measurements from a limited number of sensors before and after an anomaly has occurred. For example, in various embodiments the method estimates that power is being stolen using estimates of the voltage/current level of other non-observing nodes of the network to identify the impacted locations or the locations at high risk. Electrical networks are typically modeled as undirected (bidirectional) networks.

Figure 11B:
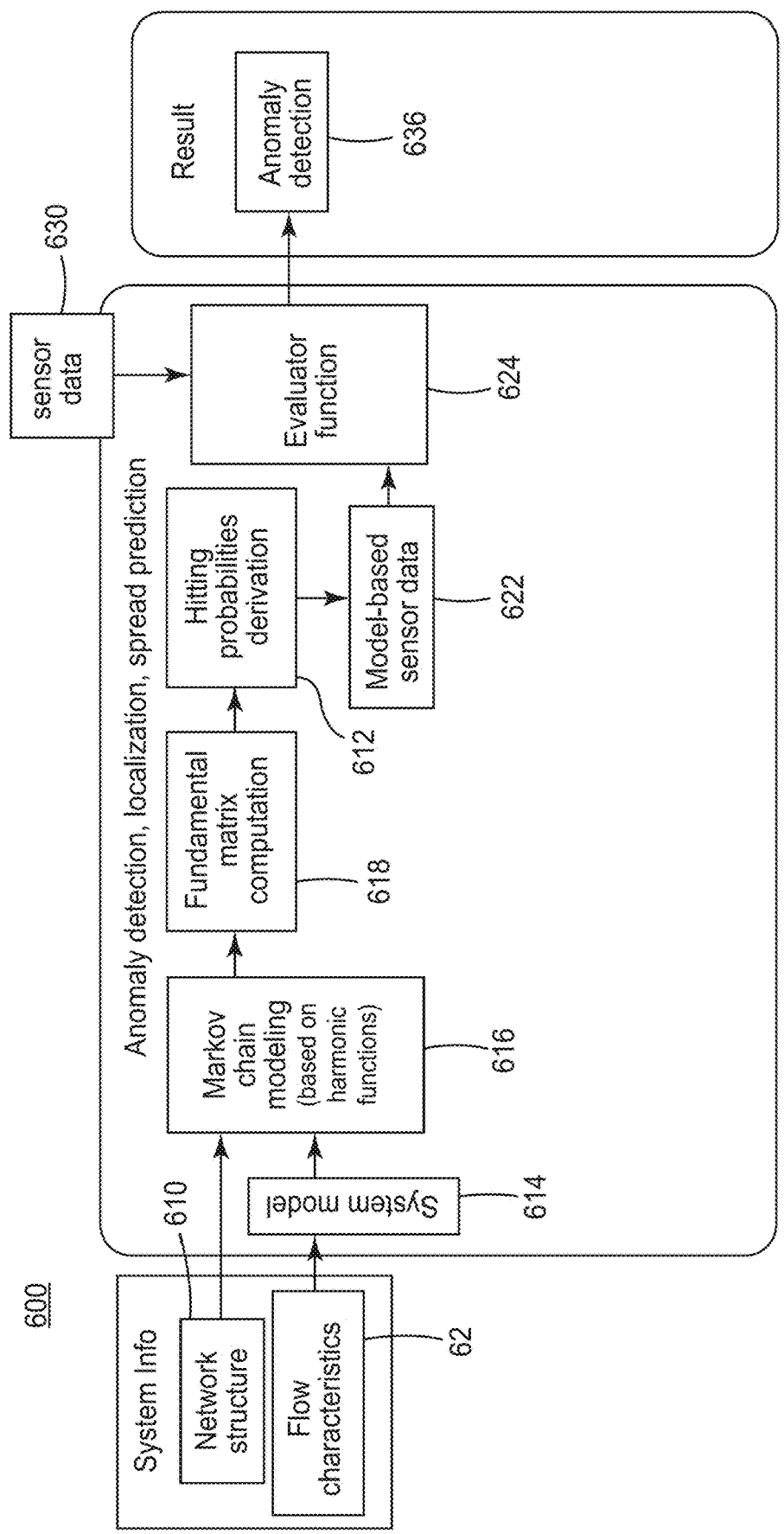
FIG. 11B is a flow diagram of a system for anomaly detection of an electrical network using Markov chain statistical modeling, according to an embodiment.

FIG. 11B is a flow diagram of a system for anomaly detection of an electrical network using Markov chain statistical modeling, according to an embodiment. In FIG. 11B statistical modeling module 616 is a Markov chain modeling module 616. For the application of electricity theft, we pick voltage as the metric to model our harmonic function. The network is modeled as a Markov chain, where states represent the nodes and transitions are happen through network links. The power source and the ground are modeled as the absorbing states. The transition probability matrix of states is computed from adjacency matrix (consisting of link resistors and node connection):

$$P=D^{-1} A_j$$

Processing system 600 uses Markov chain modeling based on harmonic functions 616 and fundamental matrix computation 618 to perform a hitting probabilities derivation 612 and use model-based sensor data 622 to evaluate the system information (network structure 610 and flow characteristics 620) in view of the sensor data 630 by evaluator module 624 to provide anomaly detection 636.

Figure 11C:
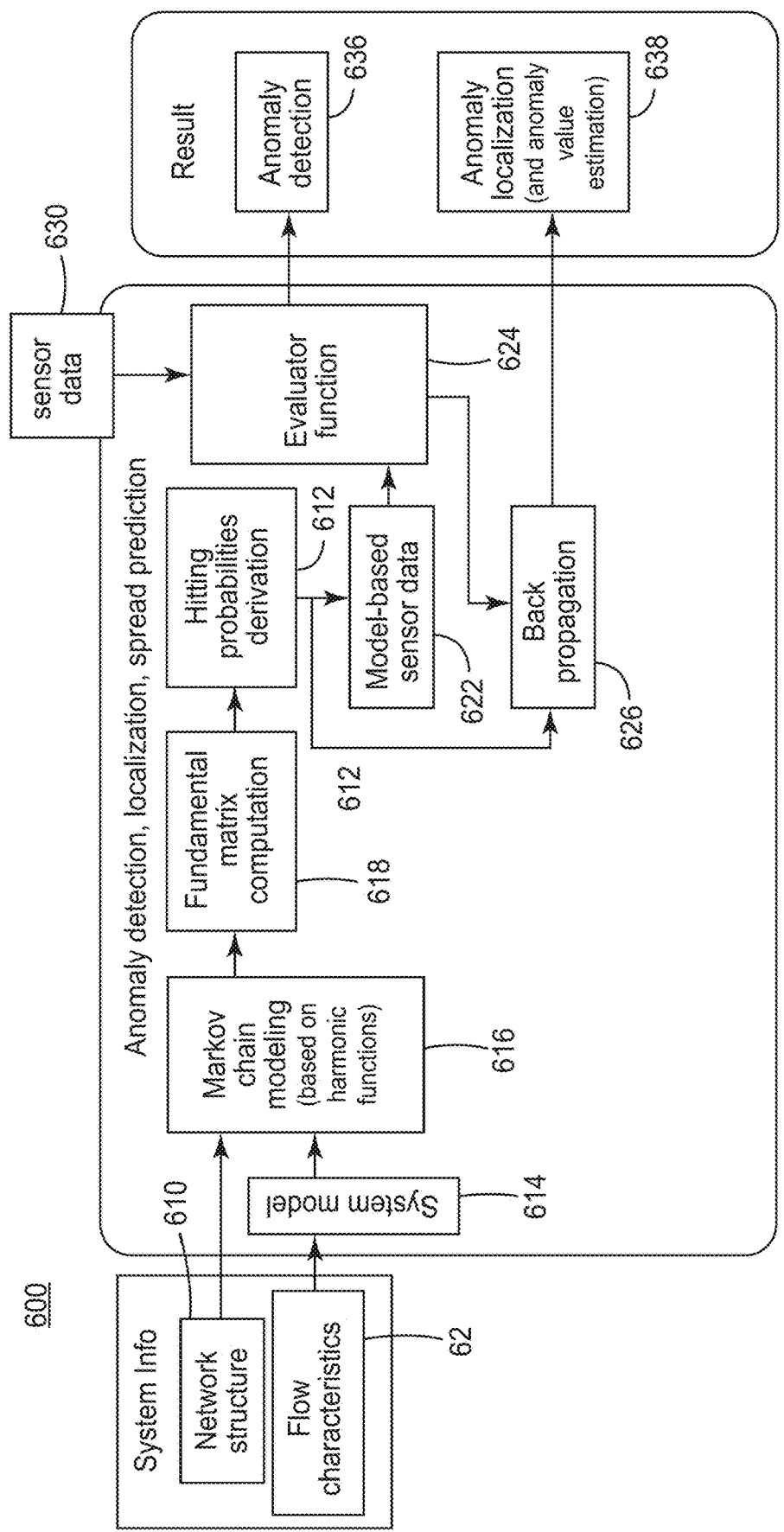
FIG. 11C is a flow diagram of a system for anomaly detection and anomaly localization of an electrical network using Markov chain statistical modeling, according to an embodiment.

FIG. 11C is a flow diagram of a system for anomaly detection and anomaly localization of an electrical network using Markov chain statistical modeling, according to an embodiment. Various embodiments provide localization of the anomaly 638 by adding a back propagation module 626 to the system of FIG. 11B. This provides localization of the detected anomalies.

Figure 11D:
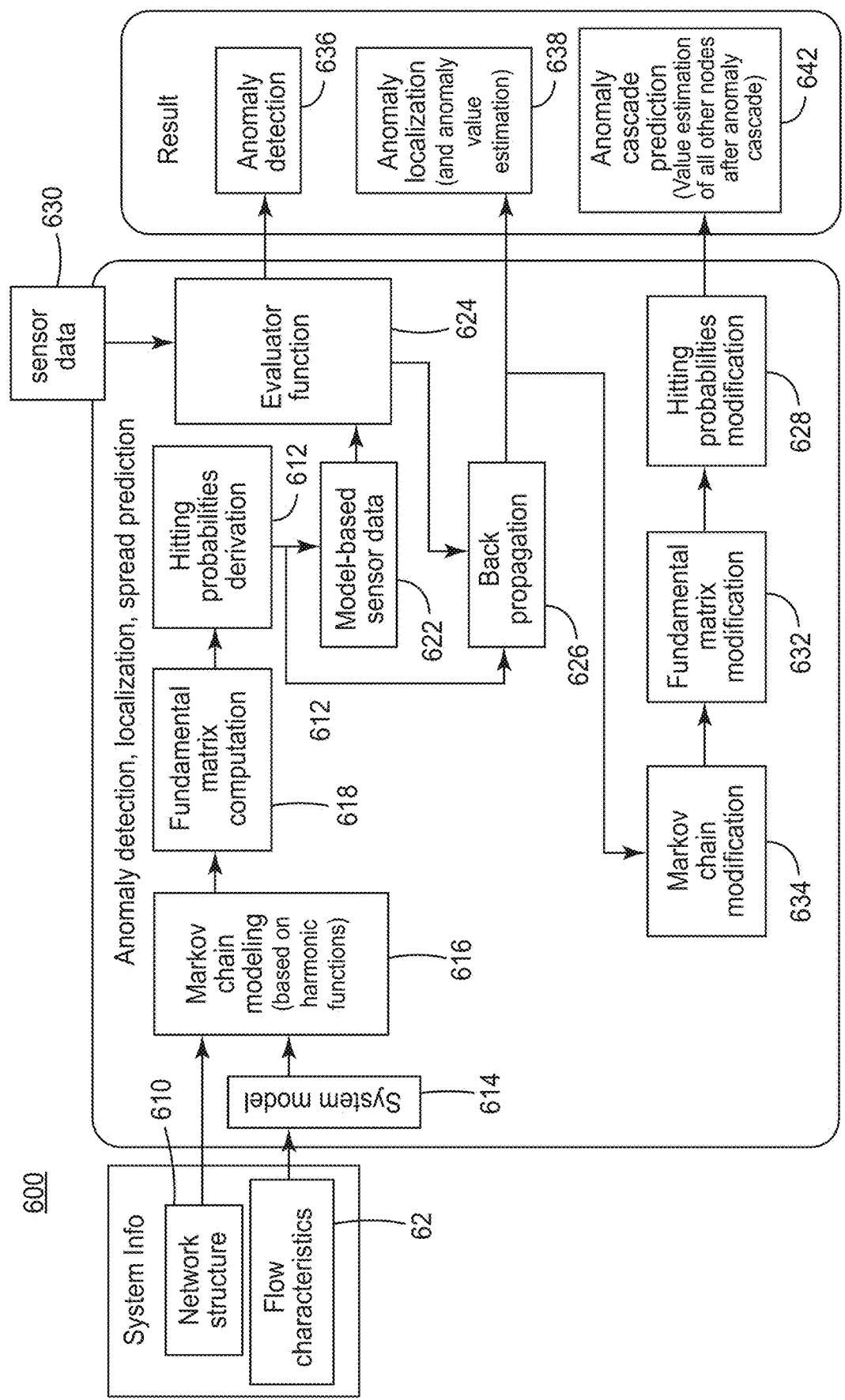
FIG. 11D is a flow diagram of a system for anomaly detection, anomaly localization, and anomaly cascade prediction of an electrical network using Markov chain statistical modeling, according to an embodiment.

FIG. 11D is a flow diagram of a system for anomaly detection, anomaly localization, and anomaly cascade prediction of an electrical network using Markov chain statistical modeling, according to an embodiment. Various embodiments additional perform Markov chain modification 634, fundamental matrix modification 632 and hitting probabilities modification 628 to provide anomaly cascade prediction 642. Anomaly cascade prediction 642 provides a value estimation of metrics or variables for the other nodes of the electrical system after an anomaly cascade. This gives users of the electrical network further insight as to how the system is tolerating the anomaly on a node-by-node basis, and the number and localization of the nodes impacted by the anomaly.

Figure 12:
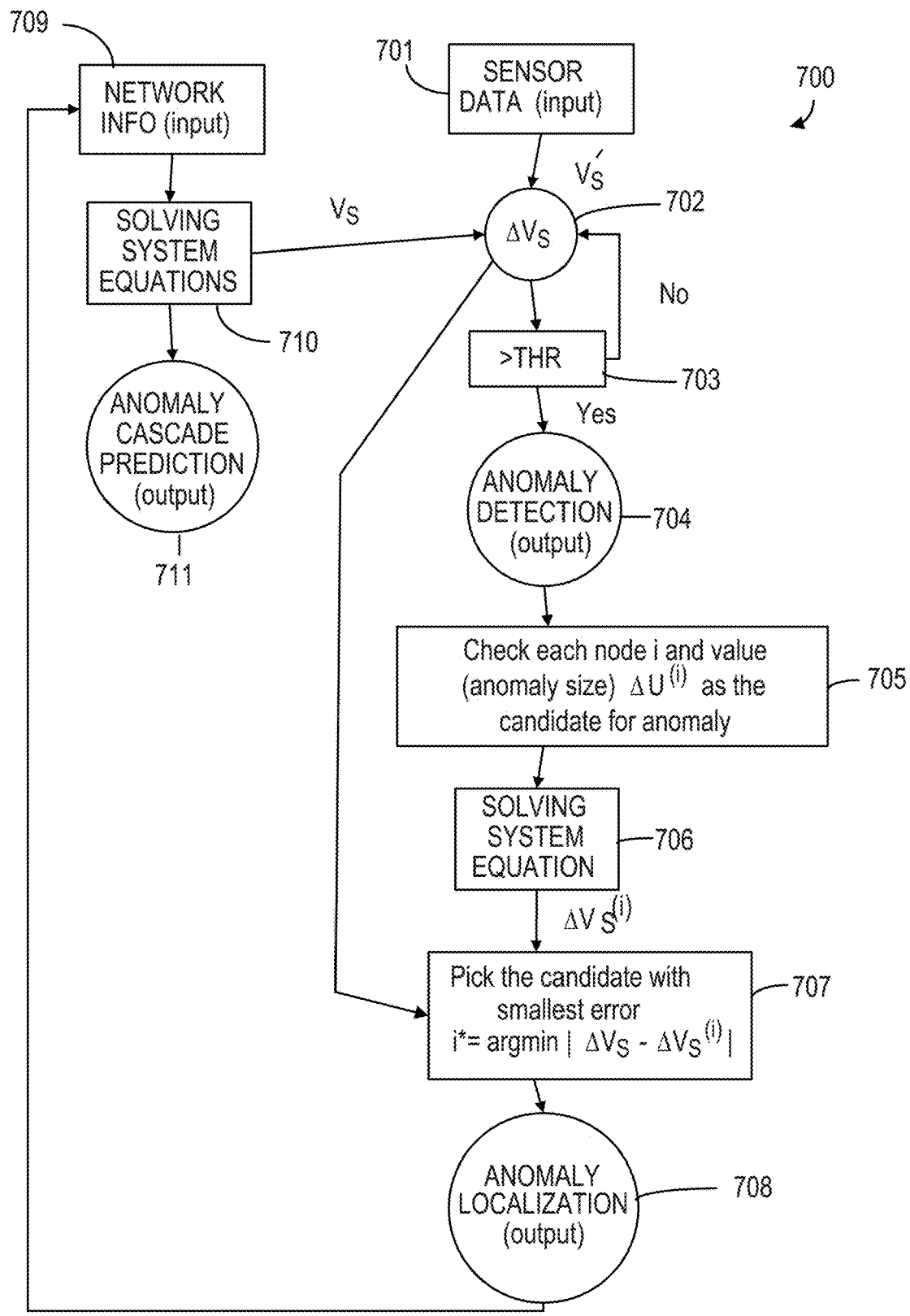
FIG. 12 is a flow diagram demonstrating one example of a data analysis of sensor data and network information in an electrical network, according to an embodiment.

FIG. 12 is a flow diagram demonstrating one example of a data analysis of sensor data and network information in an electrical network, according to an embodiment. In process flow diagram 700, assume that sensors are placed on an electrical grid and that digitized information 709 of the electrical network grid is input with digitized sensor information collected from sensors on the network grid 701 to operation node 702. The expected value at a sensor location ($V_s$) is provided by solving system equations 710 and can be compared with the real value obtained from the sensor location ($V_s^i$) using comparison module 703. It is understood that in various applications the expected versus real value measurements may be voltage, power, current, electron flow, etc. If the comparison does not exceed a threshold 703, the next node is checked as flow returns to module 702. If the comparison exceeds a threshold 703 then an anomaly detection is output by anomaly detection module 704. In various embodiments, anomaly detection module calculates a probabilistic, binary confidence interval. In embodiments involving anomaly localization, the output of the anomaly detection module 704 triggers step 705 which checks each node "i" and value (anomaly size) $\Delta U^{(i)}$ as the candidate for an anomaly. The solving system equation module 706 uses outputs from step 705 and provides $\Delta V_s^{(i)}$. The candidate with the smallest error is picked ($i^*=\mathrm{argmin}|\Delta V_s - \Delta V_s^{(i)}|$) at step 707, and anomaly localization is output at module 708. Any changes to the network information are applied to the network information module 709 which is applied to solving system equations 710. The anomaly cascade prediction module 711 predicts the impact of the anomaly on various affected nodes of the system and outputs them in embodiments featuring an anomaly cascade prediction output.

Figure 13:
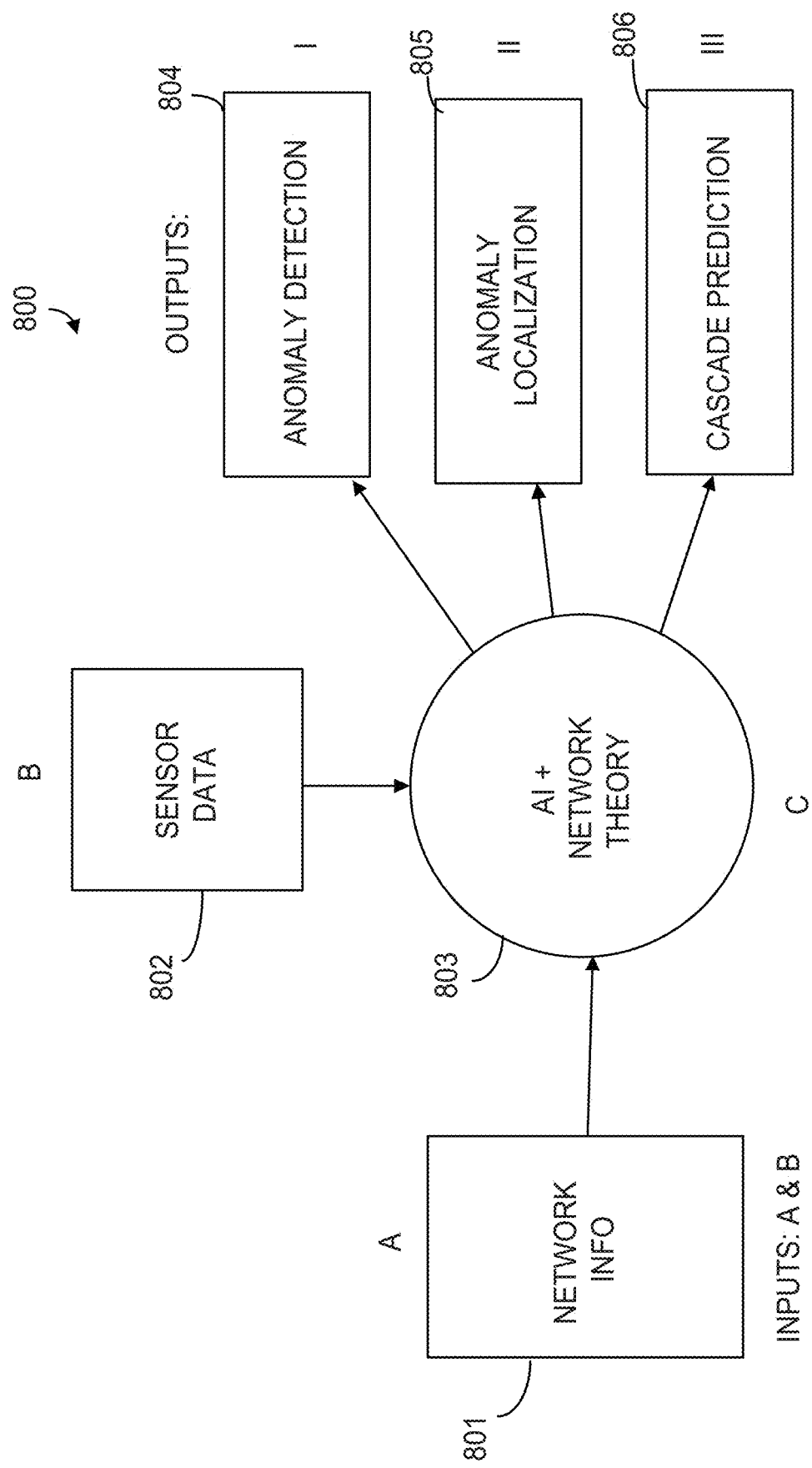
FIG. 13 is a block diagram showing a data analysis system having sensor data and network information inputs and various outputs using artificial intelligence and network theory, according to an embodiment.

In various embodiments, the system of FIG. 13 is performed, for example, by the analysis step 140 of FIG. 1. It is understood that the order of analysis and steps and modules involved may be performed in hardware, software, firmware, and in combinations thereof. Variations in order and performed functions may vary without departing from the scope and spirit of the present subject matter. In various embodiments, the algorithms and software operating on the systems of FIG. 10, FIGS. 11A-11D, and FIG. 13 may be performed by the system of FIG. 2, such as processor 212 and memory 214 of computation component 226. In various embodiments, distributed processing and storage, such as cloud embodiments, may be employed with the system of FIG. 2, or in combination. Outputs are provided by the I/O device 216 or user interface 218, or on other connected apparatus, depending on the particular implementation and application.

FIG. 13 is a block diagram showing a data analysis system 800 having sensor data 802 and network information 801 inputs and various outputs 804 (anomaly detection), 805 (anomaly localization), and 806 (cascade prediction) using artificial intelligence and network theory 803, according to an embodiment. In various embodiments, network information 801 includes network topology (e.g., an adjacency matrix A, as shown in FIG. 15, which is symmetric for bidirectional flow), flow model providing boundary (e.g., absorbing) node information, and providing flow characteristics (e.g., power start; ground end).

Figure 14:
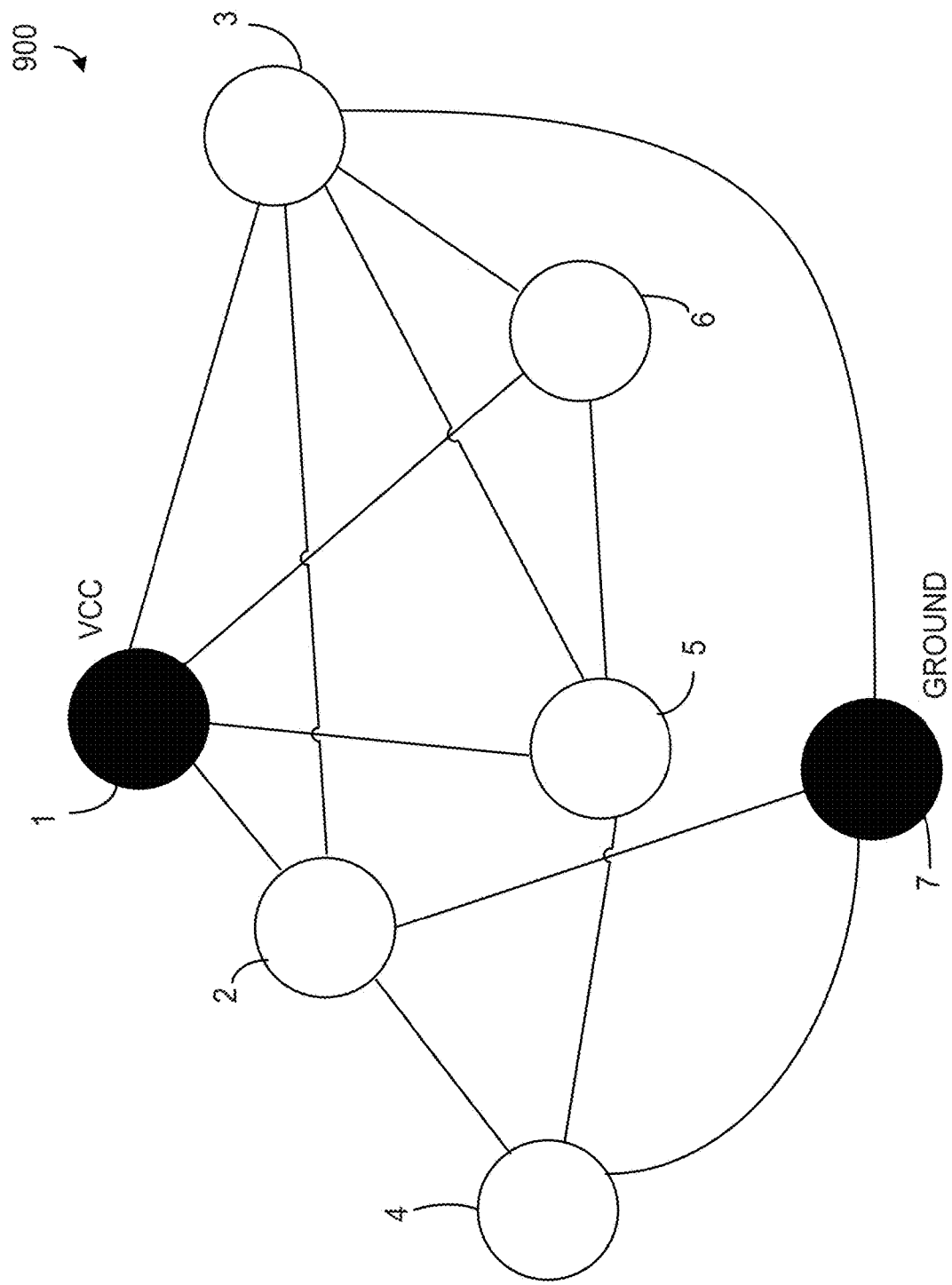
FIG. 14 is a node diagram showing various nodes in an example of a network structure of an electrical network, according to an embodiment.

FIG. 14 is a node diagram showing various nodes in an example of a network structure of an electrical network, according to an embodiment. Power (Vcc, node 1) is interconnected to nodes 2-6, and ground node 7 as shown. Various measurements between the nodes can be performed and represented in a table, such as the matrix in FIG. 15. FIG. 15 is an adjacency matrix (matrix A is symmetric for bidirectional flow) showing measured resistance values of the links of the structure of FIG. 14, according to an embodiment. In this matrix, all of the links have a resistance of either 100 Kohm or 1000 Kohm (if referenced to ground). (The zeros reflect empty entries.) In a voltage measurement example, the boundary nodes are Vcc (node ID=1), value=5 Volts; and Ground (node ID=7), value=0 Volts. The electrical network can be characterized in terms of current and voltage using Kirchoff's Current Law and Kirchoff's Voltage Law. The sensors are installed at node ID's=2 and 4, and the sensor reads voltage.

Figure 16:
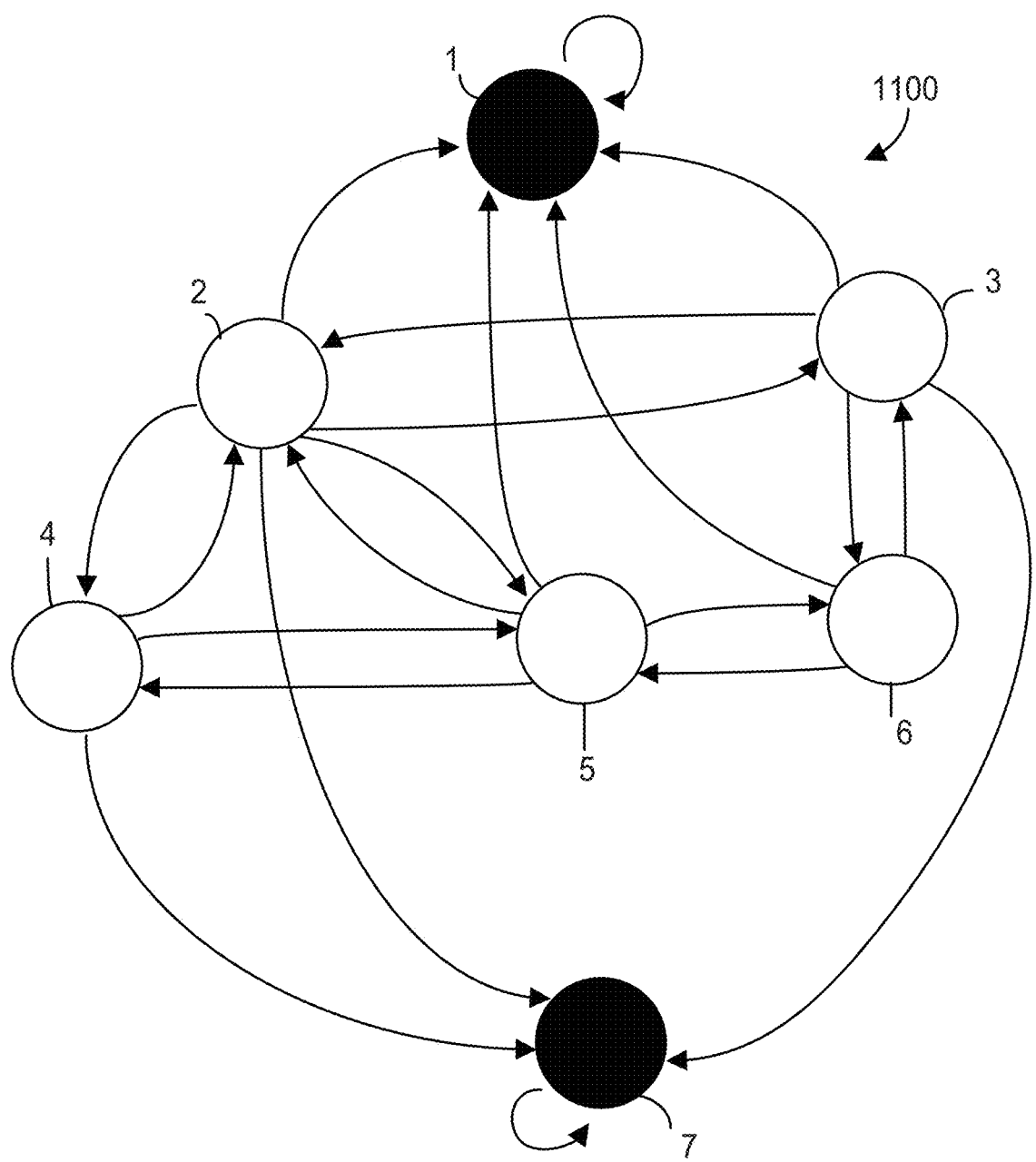
FIG. 16 is a node diagram showing various node measurements for calculations of the network structure of FIG. 14, according to an embodiment.

FIG. 16 is a node diagram showing various node measurements for calculations of the network structure of FIG. 14, according to an embodiment. To demonstrate the measurement algorithm, according to one embodiment, first, Absorbing Markov Chain modeling with transition probability matrix P, where $P=D^{-1}A$ and $D=diag(sum(A, 2))$ is performed.

Next, it is proved that the voltage at node I is equal to the absorption probability by Vcc node multiplied by the Vcc voltage, starting from node "i". (See for example, Snell & Doyle, "Random Walk and Electrical Networks," https://arxiv.org/abs/math/0001057, January 2000, and https://math.dartmouth.edu/~doyle/docs/walks/walks.pdf, Jul. 5, 2006.). A fundamental matrix (F) is calculated from which the absorption probabilities are computed: $F=(I-P_a)^{-1}$, where $P_a$ is the matrix resulted from removing absorbing nodes' rows and columns (e.g., the $1^{st}$ and $7^{th}$ rows and columns in this example).

The present subject matter can be applied to a variety of different applications including, but not limited to electrical networks, power distribution systems, fiber optic networks, battery fuel cells.

Unless otherwise indicated, all numbers expressing quantities or ingredients, measurement of properties and so forth used in the specification and embodiments are to be understood as being modified in all instances by the term "about." Accordingly, unless indicated to the contrary, the numerical parameters set forth in the foregoing specification and attached listing of embodiments can vary depending upon the desired properties sought to be obtained by those skilled in the art utilizing the teachings of the present disclosure. At the very least, and not as an attempt to limit the application of the doctrine of equivalents to the scope of the claimed embodiments, each numerical parameter should at least be construed in light of the number of reported significant digits and by applying ordinary rounding techniques.

Exemplary embodiments of the present disclosure may take on various modifications and alterations without departing from the spirit and scope of the present disclosure. Accordingly, it is to be understood that the embodiments of the present disclosure are not to be limited to the following described exemplary embodiments, but is to be controlled by the limitations set forth in the claims and any equivalents thereof.

Listing of Exemplary Embodiments

Exemplary embodiments are listed below. It is to be understood that any of embodiments in lists I and II can be combined.

Embodiment List I

Embodiment 1 is a system for detecting anomalies in a bidirectional electrical network with a plurality of sensors distributed throughout nodes of the electrical network, comprising:

a network processor, comprising:

a network topology storage having a network input for receipt of network node information, including a description of electrical node requirements of a plurality of nodes of the network, including node-to-node connectivity;

a sensor data storage including a sensor data input for receipt of sensor measurements from the plurality of sensors and information associating each measurement with a sensor node location within the network;

an electrical system model storage including relationships between the sensor measurements and electrical node requirements at each node of the electrical network;

a network matrix calculator configured to receive the network node information and electrical node requirements, and to generate a statistical expected measurement range at each sensor node location; and a comparison module configured to compare the sensor measurements with the statistical expected measurement range for each sensor node location of the electrical network, and to generate an anomaly detection for each node where the sensor measurements fall outside the statistical expected measurement range.

Embodiment 2 is the system of embodiment 1, further comprising an anomaly localization module configured to identify a node or nodes associated in the network associated with an anomaly detection.

Embodiment 3 is the system of embodiment 2, further comprising an anomaly cascade prediction calculator configured to recalculate statistical expected measurement ranges for each node of the electrical network based on an anomaly detection.

Embodiment 4 is the system of any one of embodiments 1-3, wherein the network matrix calculator includes a Markov chain modeling module to predict network node measurements based on harmonic functions.

Embodiment 5 is the system of any one of embodiments 1-4, wherein the anomaly cascade prediction calculator includes a Markov chain modification module to recalculate network node measurements based on a detected anomaly.

Embodiment 6 is the system of any one of embodiments 1-5, wherein the electrical system model storage relationships are based on Kirchoff's Current Law (KCL).

Embodiment 7 is the system of any one of embodiments 1-5, wherein the electrical system model storage relationships are based on Kirchoff's Voltage Law (KVL).

Embodiment 8 is the system of embodiment 6, wherein the anomaly cascade prediction calculator is used to identify non-monitored nodes which will experience high current drops due to the detected anomaly.

Embodiment 9 is the system of embodiment 7, wherein the anomaly cascade prediction calculator is used to identify non-monitored nodes which will experience high voltage drops due to the detected anomaly.

Embodiment List II

Embodiment 10 is a method for detecting anomalies in an electrical network using a plurality of sensors distributed throughout nodes of the electrical network, the method comprising:
receiving network node information, including receiving a description of electrical node requirements of a plurality of nodes of the network;
receiving sensor measurements from the plurality of sensors and information associating each measurement with a sensor node location within the network;
receiving an electrical system model including relationships between the sensor measurements and electrical node requirements at each node of the electrical network;
using the network node information and electrical node requirements to calculate a statistical expected measurement range at each sensor node location;
comparing the sensor measurements with the statistical expected measurement range for each sensor node location of the electrical network, and generating an anomaly detection for each node where the sensor measurements exceeded the statistical expected measurement range.

Embodiment 11 is the method of embodiment 10, further comprising identifying a node or nodes associated in the network associated with an anomaly detection.

Embodiment 12 is the method of embodiment 11, further comprising recalculating statistical expected measurement ranges for each node of the electrical network based on an anomaly detection.

Embodiment 13 is the method of any one of embodiments 10-12, further comprising using Markov chain modeling to predict network node measurements based on harmonic functions.

Embodiment 14 is the method of any one of embodiments 10-13, further comprising using Markov chain modeling to recalculate network node measurements based on a detected anomaly.

Embodiment 15 is the method of any one of embodiments 10-14, wherein the electrical node requirements are based on Kirchoff's Current Law (KCL).

Embodiment 16 is the method of any one of embodiments 10-14, wherein the electrical node requirements are based on Kirchoff's Voltage Law (KVL).

Embodiment 17 is the system of embodiment 15, further comprising using Markov chain modeling to identify non-monitored nodes which will experience high current drops due to a detected anomaly.

Embodiment 18 is the system of embodiment 16, further comprising using Markov chain modeling to identify non-monitored nodes which will experience high voltage drops due to a detected anomaly.

Reference throughout this specification to "one embodiment," "certain embodiments," "one or more embodiments," or "an embodiment," whether or not including the term "exemplary" preceding the term "embodiment," means that a particular feature, structure, material, or characteristic described in connection with the embodiment is included in at least one embodiment of the certain exemplary embodiments of the present disclosure. Thus, the appearances of the phrases such as "in one or more embodiments," "in certain embodiments," "in one embodiment," or "in an embodiment" in various places throughout this specification are not necessarily referring to the same embodiment of the certain exemplary embodiments of the present disclosure. Furthermore, the particular features, structures, materials, or characteristics may be combined in any suitable manner in one or more embodiments.

While the specification has described in detail certain exemplary embodiments, it will be appreciated that those skilled in the art, upon attaining an understanding of the foregoing, may readily conceive of alterations to, variations of, and equivalents to these embodiments. Accordingly, it should be understood that this disclosure is not to be unduly limited to the illustrative embodiments set forth hereinabove. In particular, as used herein, the recitation of numerical ranges by endpoints is intended to include all numbers subsumed within that range (e.g., 1 to 5 includes 1, 1.5, 2, 2.75, 3, 3.80, 4, and 5). In addition, all numbers used herein are assumed to be modified by the term "about."

Furthermore, various exemplary embodiments have been described. These and other embodiments are within the scope of the following claims.

What is claimed is:

1. A system for detecting anomalies in an electrical network with a plurality of sensors distributed throughout a plurality of nodes of the electrical network, the system comprising:
a network topology storage having a network input configured to receive network node information that includes a description of electrical node requirements of the plurality of nodes of the electrical network, the description including node-to-node connectivity information;
a sensor data storage unit including a sensor data input configured to receive sensor measurements from the plurality of sensors and information associating each measurement with a respective sensor node location within the electrical network;
an electrical system model storage unit configured to store relationships between the sensor measurements and electrical node requirements at each node of the plurality of nodes of the electrical network;
a network matrix calculator configured to:
receive the network node information and the electrical node requirements; and
generate a statistical expected measurement range at each sensor node location;

a comparison module configured to:
- compare the sensor measurements with the statistical expected measurement range for each sensor node location of the electrical network; and
- generate an anomaly detection for each node where the sensor measurements fall outside the statistical expected measurement range;

an anomaly localization module configured to identify one or more nodes of the plurality of nodes based on the identified one or more nodes being associated with an anomaly detected in the electrical network; and an anomaly cascade prediction calculator configured to recalculate statistical expected measurement ranges for each respective node of the plurality of nodes of the electrical network based on the anomaly detection in the electrical network.

2. The system of claim 1, wherein the network matrix calculator includes a Markov chain modeling module configured to predict network node measurements based on harmonic functions.

3. The system of claim 2, wherein the anomaly cascade prediction calculator includes a Markov chain modification module to recalculate the network node measurements based on the anomaly detected in the electrical network.

4. The system of claim 3, wherein the relationships stored to the electrical system model storage unit are based on Kirchoff's Current Law (KCL).

5. The system of claim 4, wherein the anomaly cascade prediction calculator is further configured to identify non-monitored nodes of the plurality of nodes based on the non-monitored nodes being susceptible to high current drops due to the anomaly detected in the electrical network.

6. The system of claim 3, wherein the relationships stored to the electrical system model storage unit are based on Kirchoff's Voltage Law (KVL).

7. The system of claim 6, wherein the anomaly cascade prediction calculator is further configured to identify the non-monitored nodes based on the non-monitored nodes being susceptible to high voltage drops due to the anomaly detected in the electrical network.

8. The system of claim 1, wherein the electrical network is a bidirectional electrical network.

9. A method of detecting anomalies in an electrical network using a plurality of sensors distributed throughout a plurality of nodes of the electrical network, the method comprising:
- receiving network node information that includes a description of electrical node requirements of the plurality of nodes of the electrical network, the description including node-to-node connectivity information;
- receiving sensor measurements from the plurality of sensors and information associating each measurement with a respective sensor node location within the electrical network;
- receiving an electrical system model including relationships between the sensor measurements and the electrical node requirements at each node of the plurality of nodes of the electrical network;
- calculate a statistical expected measurement range at each sensor node location using the network node information and the electrical node requirements;
- comparing the sensor measurements with the statistical expected measurement range for each sensor node location of the electrical network;
- generating an anomaly detection for each node where the sensor measurements exceeded the statistical expected measurement range identifying one or more nodes of the plurality of nodes based on the identified one or more nodes being associated in the network associated with an anomaly detected in the electrical network; and
- recalculating statistical expected measurement ranges for each respective node of the plurality of nodes of the electrical network based on the anomaly detected in the electrical network.

10. The method of claim 9, further comprising predicting network node measurements based on harmonic functions using Markov chain modeling.

11. The method of claim 10, further comprising recalculating the network node measurements based on the anomaly detected in the electrical network using Markov chain modeling.

12. The system of claim 11, wherein the electrical node requirements are based on Kirchoff's Current Law (KCL).

13. The system of claim 12, further comprising identifying, using Markov chain modeling, non-monitored nodes based on the non-monitored nodes being susceptible to high current drops due to the anomaly detected in the electrical system.

14. The system of claim 11, wherein the electrical node requirements are based on Kirchoff's Voltage Law (KVL).

15. The method of claim 9, wherein the electrical network is a bidirectional electrical network.

* * * * *

UNITED STATES PATENT AND TRADEMARK OFFICE
CERTIFICATE OF CORRECTION

PATENT NO. : 11,143,685 B2  
APPLICATION NO. : 16/647539  
DATED : October 12, 2021  
INVENTOR(S) : Golshan Golnari et al.

Page 1 of 1

It is certified that error appears in the above-identified patent and that said Letters Patent is hereby corrected as shown below:

In the Claims

Column 24  
Line 21, In Claim 9, after "range", insert --;--.

Signed and Sealed this  
Twenty-sixth Day of April, 2022

Katherine Kelly Vidal  
*Director of the United States Patent and Trademark Office*